US006495416B1

(12) United States Patent  
Ito et al.

(10) Patent No.: US 6,495,416 B1
(45) Date of Patent: Dec. 17, 2002

(54) SEMICONDUCTOR INTEGRATED CIRCUIT DEVICE WITH MOS TRANSISTOR AND MOS CAPACITOR AND METHOD FOR MANUFACTURING THE SAME

(75) Inventors: Yasushi Ito, Iwate-ken (JP); Kenji Yoshida, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/536,744

(22) Filed: Mar. 28, 2000

Related U.S. Application Data

(62) Division of application No. 09/095,593, filed on Jun. 11, 1998, now Pat. No. 6,057,572.

(30) Foreign Application Priority Data

Jun. 14, 1997 (JP) .............................................. 9-172955

(51) Int. Cl.[7] ......................................... H01L 21/8242
(52) U.S. Cl. ..................................... 438/251; 438/252
(58) Field of Search .................................. 438/251, 252, 438/FOR 189, FOR 212, FOR 220

(56) References Cited

U.S. PATENT DOCUMENTS

| | | | | |
|---|---|---|---|---|
| 3,968,562 A | * | 7/1976 | Van Lierop | |
| 4,075,045 A | * | 2/1978 | Rideout | |
| 4,125,933 A | * | 11/1978 | Baldwin | |
| 4,183,040 A | * | 1/1980 | Rideout | |
| 4,373,250 A | * | 2/1983 | Malwah | |
| 4,380,113 A | * | 4/1983 | Malwah | |
| 4,391,032 A | * | 7/1983 | Schulte | |
| 4,466,177 A | * | 8/1984 | Chao | |
| 5,883,408 A | | 3/1999 | Tsukamoto | ................. 257/296 |

* cited by examiner

Primary Examiner—George Fourson
(74) Attorney, Agent, or Firm—Foley & Lardner

(57) ABSTRACT

A method for fabricating a semiconductor device using an etching stopper film without increasing a number of steps of photoetching and without degrading the device characteristics. A MOS capacitor having a small coefficient of voltage is formed by forming a thick oxide film which is different from a gate oxide film of a MOS transistor to be formed on the same substrate and by implanting impurity of an amount which will not destroy insulation right under the oxide film. At this time, the electrode of the MOS capacitor is formed by the same layer with that of the gate electrode of the MOS transistor to equalize the height of both the electrodes.

4 Claims, 29 Drawing Sheets

SEMICONDUCTOR INTEGRATED CIRCUIT DEVICE WITH MOS TRANSISTOR AND MOS CAPACITOR AND METHOD FOR MANUFACTURING THE SAME

This application is a divisional of application Ser. No. 09/095,593, filed Jun. 11, 1998 now U.S. Pat. No. 6,057,572.

BACKGROUND OF THE INVENTION

1. Field of the Invention

The present invention relates to a semiconductor integrated circuit device and more particularly to a structure of a novel capacitor suited for an analog circuit and to a novel manufacturing method of the same.

2. Description of Related Art

It is desirable to use a device whose bias dependency (gate bias) is small for a capacitor used in an analog circuit because it is required to operate at high speed.

FIG. 1 is a sectional view of part of a known semiconductor integrated circuit device used for an analog circuit, in which a MOS type field effect transistor (hereinafter referred to as a MOS transistor) and a two-layered poly-capacitor are formed. A field oxide film 102, i.e. a device separating region, made of LOCOS or the like is formed on the surface region of a semiconductor substrate 120 made of a P-type silicon or the like. In this known device, an N-type well region (N well) 101 is formed in the semiconductor substrate 120, a P-type MOS transistor (PMOS transistor) is formed on the device region of the N well 101 and a MOS capacitor is formed on the field oxide film 102 in the N well 101. A P+ source/drain region 117 of the two-layered polytransistor is formed in a device region surrounded by the field oxide film 102. A gate oxide film 108 is formed on the part between the P+source/drain regions 117 by means of thermal oxidation, for example. A gate electrode is formed on the gate oxide film 108.

The gate electrode is composed of a first poly-silicon film 109 directly formed on the gate oxide film 108, a third poly-silicon film 114 formed on the first poly-silicon film 109, and a tungsten silicide film 115 formed on the third poly-silicon film 114. Meanwhile, a first electrode 119, made of a poly-silicon film, of the capacitor is formed on the field oxide film 102. Then, a silicon oxide film 121 which becomes a dielectric film is formed on the first electrode 119. A second electrode is formed on the silicon oxide film 121. The second electrode is composed of a second poly-silicon film 112 directly formed on the silicon oxide film 121, another third poly-silicon film 114 formed on the second poly-silicon film 112 and another tungsten silicide film 115 formed on the third poly-silicon film 114. A BPSG (Boron-doped Phospho-Silicate Glass) film 118 for example is coated on the semiconductor substrate 120 so as to protect the two-layered poly-capacitor and the MOS transistor. The surface of the BPSG film 118 is flattened by means of CMP (Chemical Mechanical Polishing), for example. A metal wire 122 on film is coated further on the semiconductor substrate, thus completing the semiconductor chip.

In the semiconductor integrated circuit, the voltage coefficient of the capacitor using the semiconductor substrate such as silicon as one electrode thereof is decided by a thickness of an insulating film between the capacitor electrode and the substrate and concentration of impurity implanted to the surface of the silicon substrate. The voltage coefficient degrades when the thickness is thinned and when the concentration is lowered. However, with the increase and further micronization of the integration of LSIs, it is required to thin the thickness of the gate oxide film of the MOS transistor in order to suppress a short channel effect. In the capacitor using the oxide film having the same thickness with the gate oxide film of the MOS transistor as the insulating film, the impurity concentration of the semiconductor substrate cannot exceed a solid solubility limit of the impurity within silicon and the insulation of the oxide film formed thereon also degrades when the concentration is too high, so that it is necessary to suppress the concentration to a certain degree. In such case, when positive or negative voltage is applied to the capacitor electrode, a depletion layer is formed on the silicon substrate side and the substantial thickness of the oxide film fluctuates due to the fluctuation of the applied voltage, thereby increasing the coefficient of voltage of the capacitance.

On the other hand, although an electrode such as a poly-silicon film different from the gate electrode may be used, for example, for the lower electrode of the capacitor in order to minimize the coefficient of voltage, the height of the capacitor forming region is thickened as compared to the gate electrode forming region by the thickness of the lower poly-silicon film as shown in FIG. 1 as a result. Further, it is essential to use a polishing process such as the CMP method as described above which does not involve heat treatment as the flattening technology in order to advance the micronization in the future. However, there arises a problem in such case that the upper electrode part of the capacitor, whose stepped structure differs, is exposed on the surface and the insulation with the upper aluminum wiring layer cannot be maintained as shown in FIG. 1.

SUMMARY OF THE INVENTION

Accordingly, it is an object of the present invention to solve the aforementioned problems by providing a semiconductor integrated circuit device which allows a high precision MOS capacitor to be formed without changing the performance of the MOS transistor formed on the same semiconductor substrate.

Further, it is another object of the present invention to provide a method for fabricating the semiconductor integrated circuit device which allows an interlayer insulating film formed on the MOS transistor and the capacitor to be readily flattened by equalizing the height of the MOS transistor and the capacitor to be formed on the same semiconductor substrate.

In order to solve the aforementioned problems, according to the present invention, a MOS capacitor whose coefficient of voltage is small is formed by forming a thick oxide film which is different from a gate oxide film of a MOS transistor to be formed on a same semiconductor substrate and by implanting impurity right under that by a degree without breaking the insulation. At this time, an electrode of the MOS capacitor is formed by the same layer with a gate oxide film of the MOS transistor to substantially equalize the height of both electrodes.

The high precision capacitor can be formed without changing the performance of the MOS transistor to be formed on the same semiconductor substrate. Further, an interlayer insulating film to be formed on the MOS transistor and the capacitor may be flattened readily by equalizing the height of the MOS transistor and the capacitor.

That is, according to one embodiment of the present invention, the semiconductor integrated circuit device includes a semiconductor substrate; a MOS type field effect transistor having a first silicon oxide film formed on the semiconductor substrate as a gate insulating film; and a capacitor having a second silicon oxide film formed on the semiconductor substrate as a dielectric film, a first electrode composed of the semiconductor substrate and a second electrode formed on the second silicon oxide film; where the second silicon oxide film is thicker than the first silicon oxide film.

Also, in another embodiment of the present invention, a semiconductor integrated circuit device has the semiconductor substrate; the MOS type field effect transistor having a first silicon oxide film formed on the semiconductor substrate as a gate insulating film; the capacitor having a second silicon oxide film formed on the semiconductor substrate as a dielectric film, and a first electrode composed of the semiconductor substrate and a second electrode formed on the second silicon oxide film; where the second silicon oxide film has a thickness which reduces a voltage dependency of the capacitor and which is thicker than the thickness of the first silicon oxide film.

An inventive method for fabricating a semiconductor integrated circuit device includes: forming a dummy gate oxide film on the surface of a semiconductor substrate on which a field oxide film is formed; implanting channel ion into a region of the semiconductor substrate where a MOS type field effect transistor is to be formed; forming a high concentrate impurity diffusing region by implanting impurity to a region of the semiconductor substrate where a capacitor is to be formed; forming an oxide film for a capacitor on the surface of the semiconductor substrate after peeling off the dummy gate oxide film; leaving the oxide film only in the region where the capacitor is to be formed and removing the oxide film at the region other than that; forming a gate oxide film on the surface of the semiconductor substrate; depositing a poly-silicon film including the gate oxide film on the surface of the semiconductor substrate; diffusing impurity in the poly-silicon film; depositing a conductive film on the poly-silicon film; patterning the poly-silicon film and the conductive film to form a gate electrode and a capacitor electrode at one time; and depositing an interlayer insulating film on the surface of the semiconductor substrate and then flattening the interlayer insulating film by a CMP process.

Another inventive method for fabricating a semiconductor integrated circuit device includes forming a dummy gate oxide film on the surface of a semiconductor substrate on which a field oxide film is formed; implanting channel ion into a region of the semiconductor substrate where a MOS type field effect transistor is to be formed; forming a high concentrate impurity diffusing region by implanting impurity to a region of the semiconductor substrate where a capacitor is to be formed; forming a gate oxide film on the surface of the semiconductor substrate after peeling off the dummy gate oxide film; depositing a first poly-silicon film on the semiconductor substrate; leaving the first poly-silicon film and the gate oxide film only in the region where the MOS type field effect transistor is to be formed and removing the poly-silicon film and the gate oxide film formed at the region other than that; forming a oxide film for a capacitor on the surface of the semiconductor substrate; depositing a second poly-silicon film on the semiconductor substrate; leaving the second poly-silicon film only in the region where the capacitor is to be formed and removing the second poly-silicon film formed at the region other than that; removing the capacitor oxide film formed on the first poly-silicon film; depositing a third poly-silicon film on the first and second poly-silicon films on the semiconductor substrate; diffusing impurity in the third poly-silicon film; depositing a conductive film on the third poly-silicon film; patterning the first, second and third poly-silicon films and the conductive film to form a gate electrode and a capacitor electrode at one time; and depositing an interlayer insulating film on the surface of the semiconductor substrate and then flattening the interlayer insulating film by a CMP process.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by the reference to the following detailed description considered in connection with the accompanying drawings, in which.

DETAILED DESCRIPTION OF THE PREFERRED EMBODIMENTS

Preferred embodiments of the present invention will be explained below with reference to the drawings.

A first embodiment will be explained at first with reference to FIGS. 2 through 4.

Figure 1:
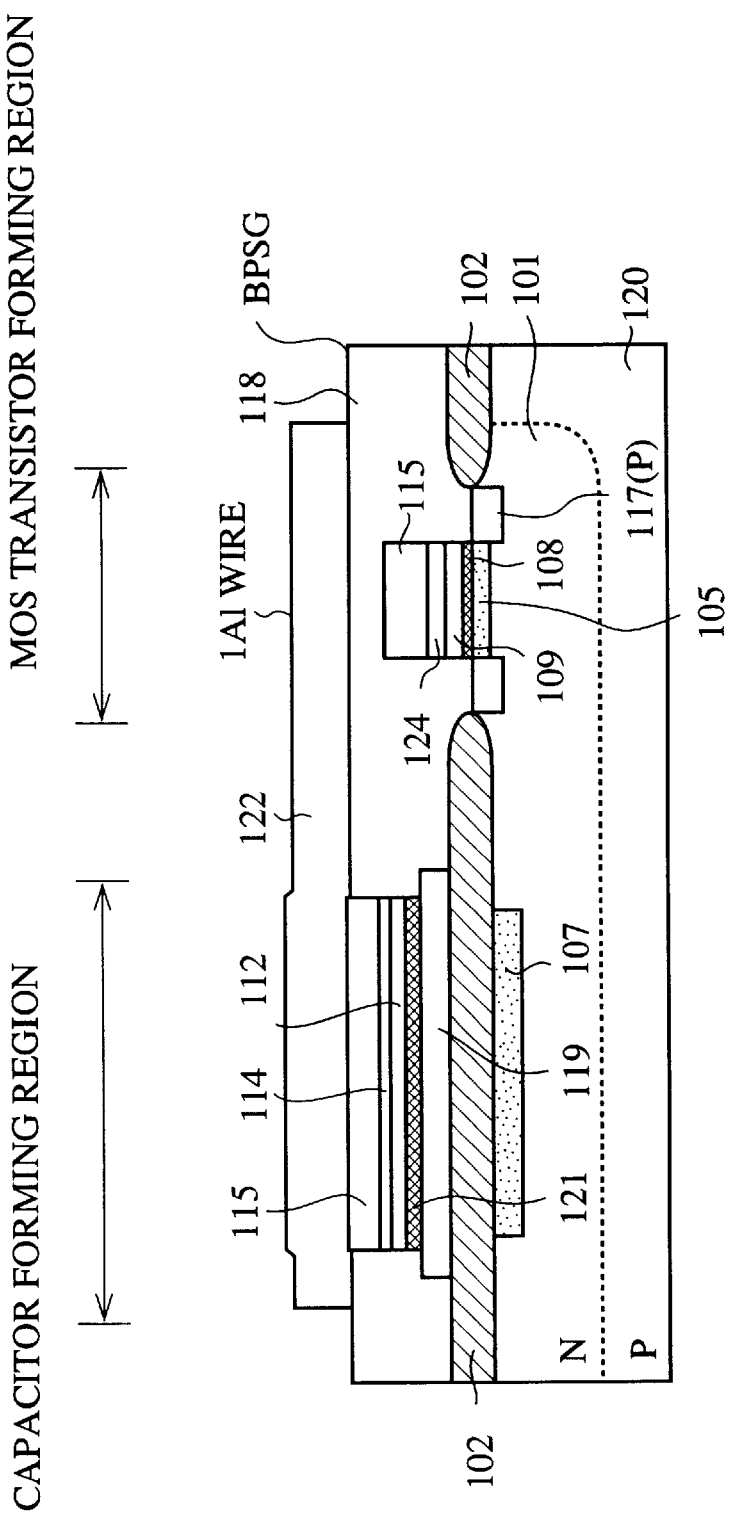
FIG. 1 is a section view of a prior art semiconductor integrated circuit device.
Figure 2:
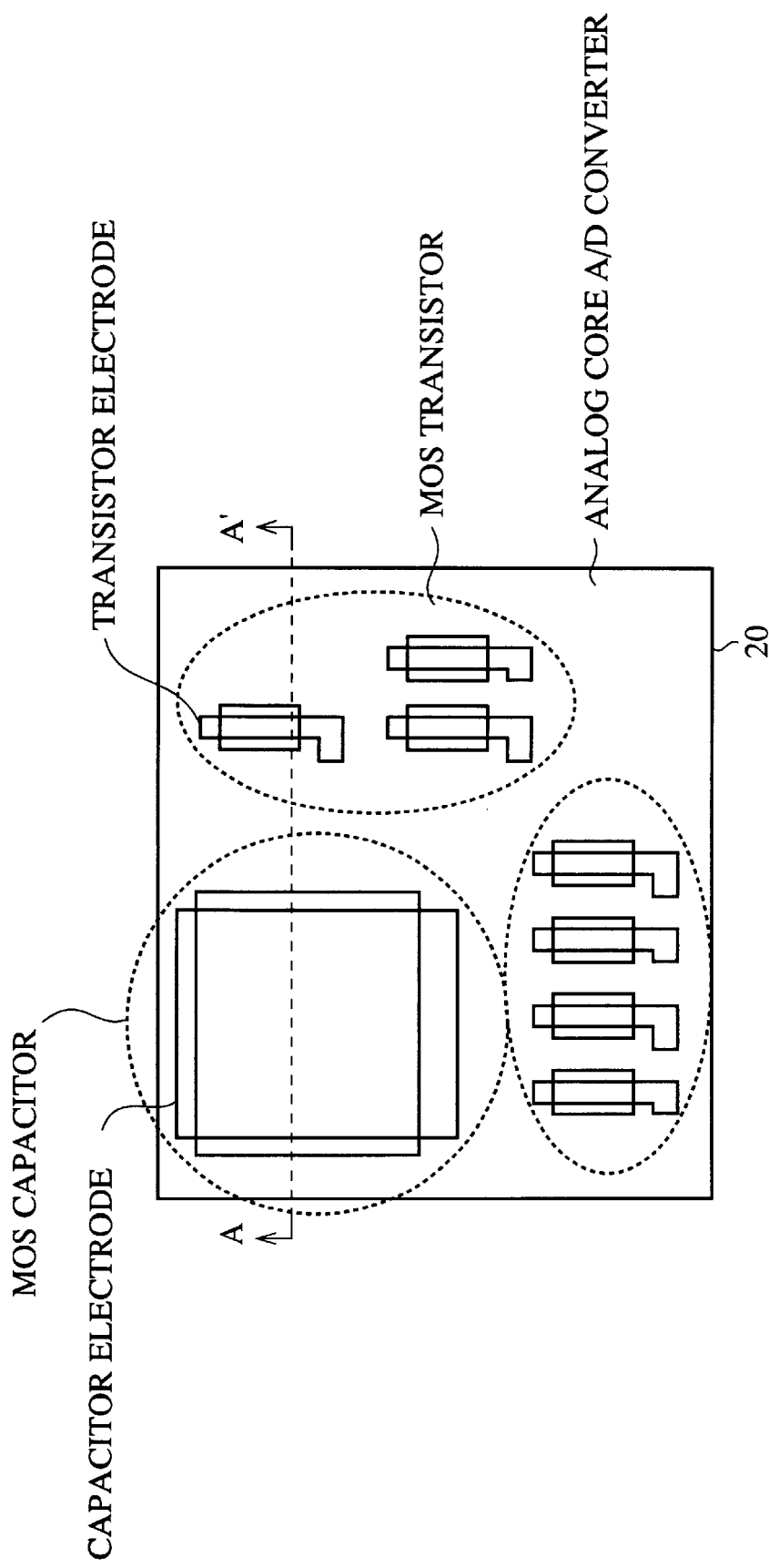
FIG. 2 is a plan view of a chip of a MOS capacitor for analog circuit formed on a same semiconductor substrate together with a MOS transistor of the present invention.
Figure 3:
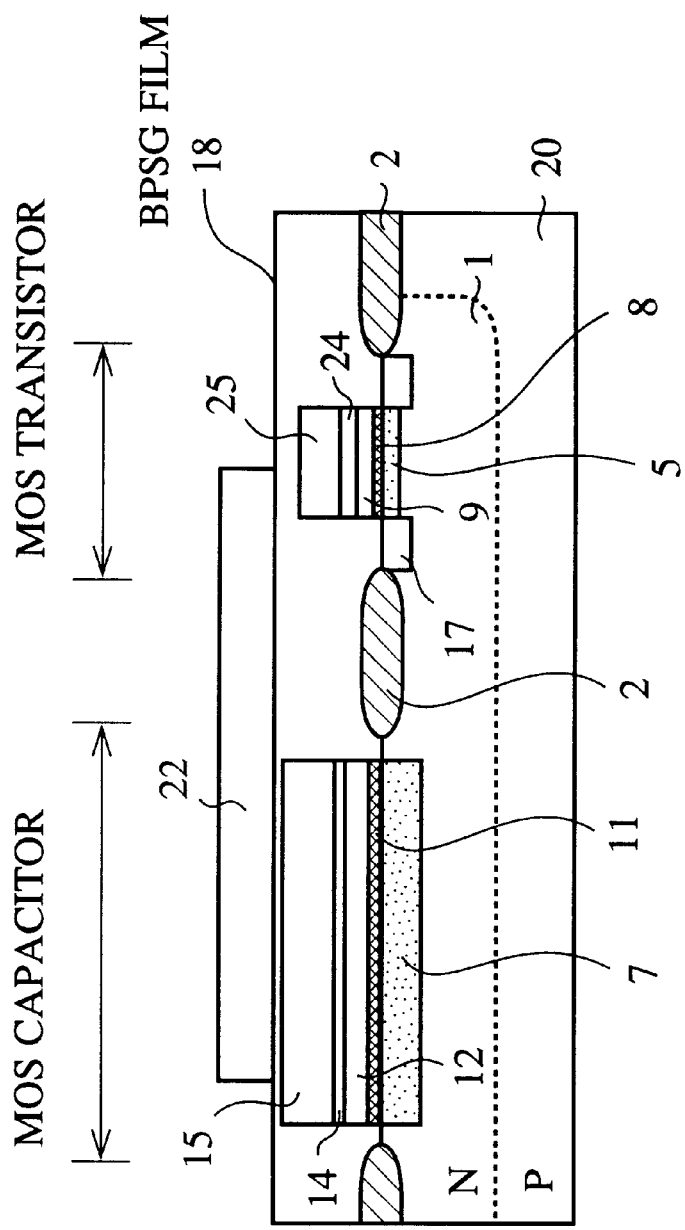
FIG. 3 is a section view of the chip along A–A' in FIG. 2.

FIG. 2 is a plan view of a chip of a MOS capacitor for analog circuit formed on the same semiconductor substrate together with a MOS transistor and FIG. 3 is a section view of the chip along A–A' in FIG. 2, where the MOS transistor and the MOS capacitor of the present embodiment are formed.

As is shown in FIG. 3, a field oxide film 2 as a device separating region, formed by LOCO or the like is formed on the surface region of a semiconductor substrate 20 made of a P-type silicon or the like. In this present embodiment, an N well 1 is formed on the semiconductor substrate 20. A PMOS transistor is formed on the first device region of the N well 1 and a MOS capacitor is formed on the second device region of the N well 1. A P+ source/drain region 17 of the MOS transistor is formed in the first device region. A gate oxide film 8 is formed on the part between the P+ source/drain region 17 by means of thermal oxidation, for example. A gate electrode is formed on the gate oxide film 8. The gate electrode is composed of a first poly-silicon film 9 directly formed on the gate oxide film 8, a third poly-silicon film 24 formed on the first poly-silicon film 9, and a tungsten silicide film 25 formed on the third poly-silicon film 24.

Meanwhile, a capacitor is formed on the second device region, a first electrode comprises P-type impurity diffusing region 7, and a second electrode is formed on second silicon oxide film 11 comprising poly-silicon film 9, poly-silicon film 14, tungsten silicide film 15, silicon oxide film 11 which becomes a dielectric film of the capacitor. Then, a capacitor electrode is formed on the silicon oxide film 11. The second electrode poly-silicon film 9, poly-silicon film 14, and tungsten silicide film 15 are formed using the same process as the gate electrode, poly-silicon film 12, poly-silicon film 14, and tungsten silicide film 15. A BPSG film 18, for example, is coated on the semiconductor substrate 20 so as to protect the MOS capacitor and the MOS transistor. The surface of the BPSG film 18 is flattened by means of CMP, for example. A metal wire 22 such as an aluminum wire is formed on the flattened surface. A passivation film is coated further on the semiconductor substrate, thus completing the semiconductor chip.

The present invention allows the MOS capacitor whose coefficient of voltage is small to be formed by forming the thick oxide film having a thickness different from the gate oxide film of the MOS transistor to be formed on the same semiconductor substrate as described above. That is, the high precision capacitor may be formed without changing the performance of the MOS transistor formed on the same semiconductor substrate. The voltage coefficient is a capacity which varies per 1 V of gate voltage and is expressed as follows:

$$Vcr = dC/dV \times 1E6 \ (ppm/V)$$

where, Vcr is the voltage coefficient.

Therefore, when the voltage coefficient is small, the variation of the capacity per unit voltage becomes small and the charging/discharging operation of the capacitor may be carried out at high speed.

Figure 4:
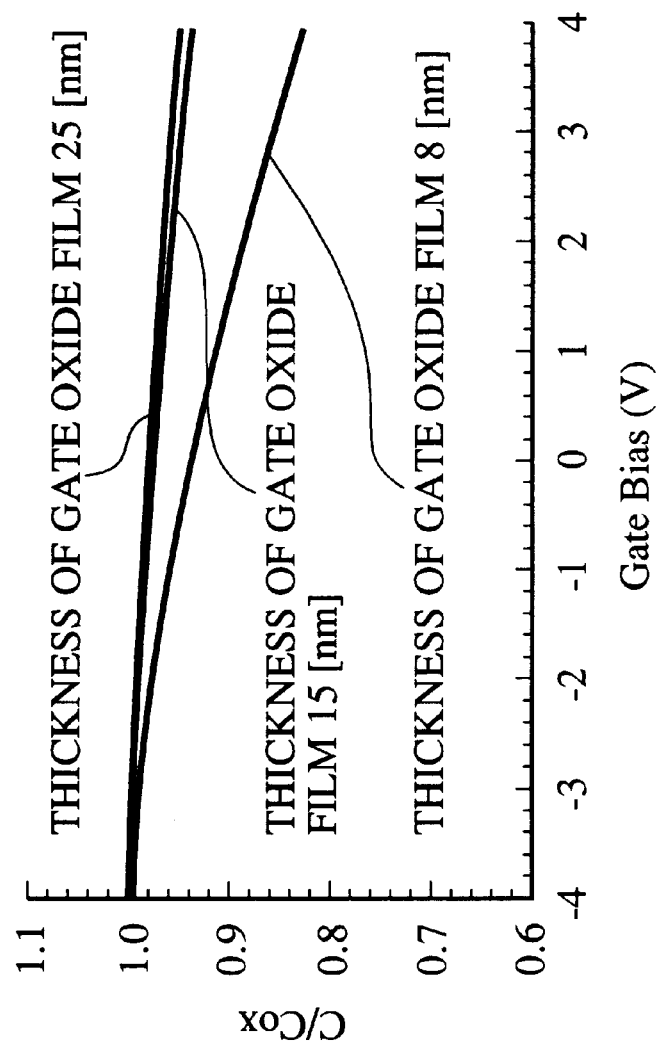
FIG. 4 is a chart showing a C-V characteristics of the capacitor showing a dependency on film thickness of a gate oxide film.

FIG. 4 is a characteristics chart showing the C-V characteristics of the MOS capacitor, i.e. the thickness dependency of the gate oxide film. The vertical axis represents a ratio of capacity C/Cox and the horizontal axis represents a gate bias (V). C denotes a value when a capacity of depletion layer is connected in series with a gate capacity and Cox denotes the gate capacity, i.e. a capacity which the gate oxide film has. It can be seen from the chart that the C-V characteristics of the MOS capacitor degrades when the gate oxide film is thin. Accordingly, the high precision capacitor as described above may be realized by thinning the thickness of the gate oxide film of the MOS transistor in correspondence to the micronization of LSIs and thickening the dielectric film of the MOS capacitor regardless of the thickness of the gate oxide film. While the thickness of the gate oxide film used in the present embodiment is reduced to 10 to 20 nm, the thickness of the dielectric film of the capacitor is around 20 nm.

Next, a second embodiment of the present invention will be explained below with reference to FIGS. 5 through 17.

Figure 15:
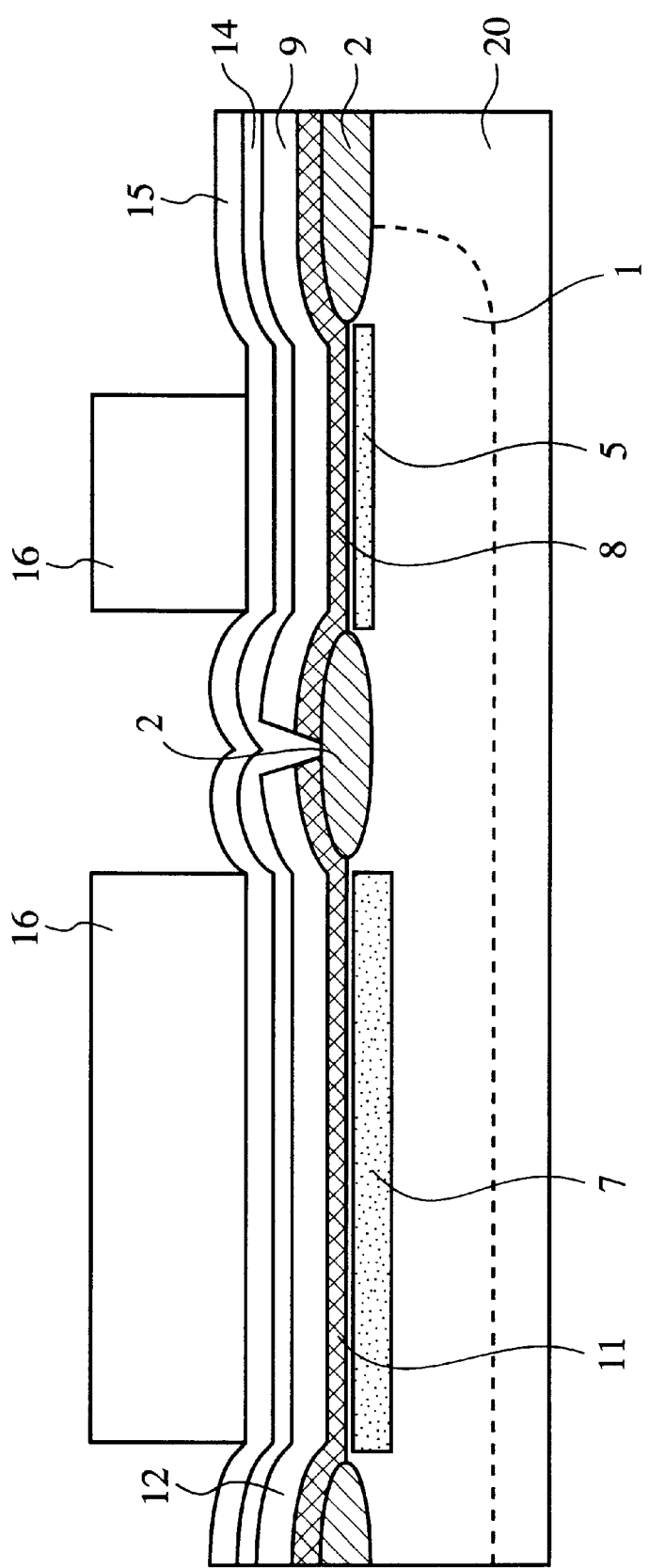
Figure 16:
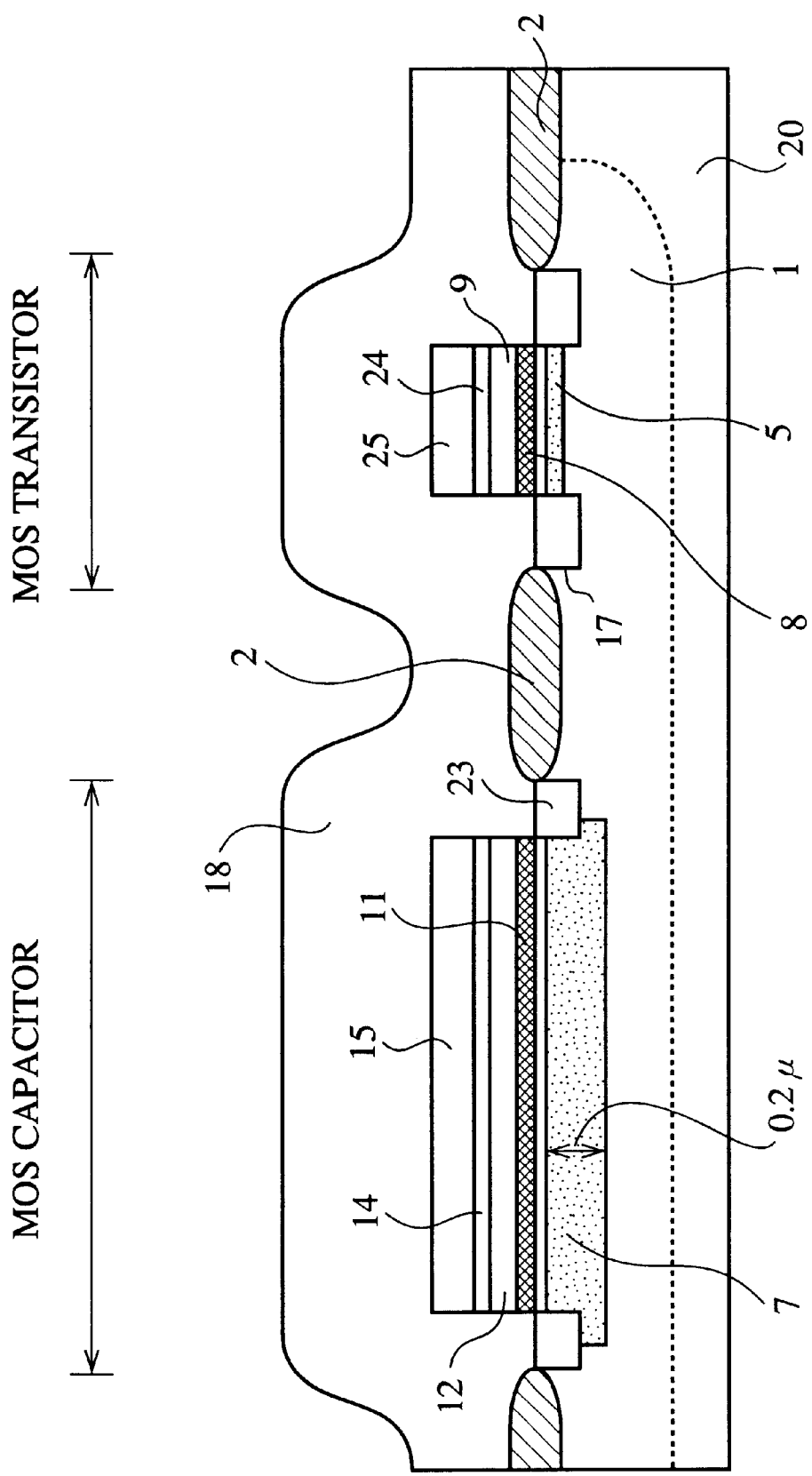
Figure 17:
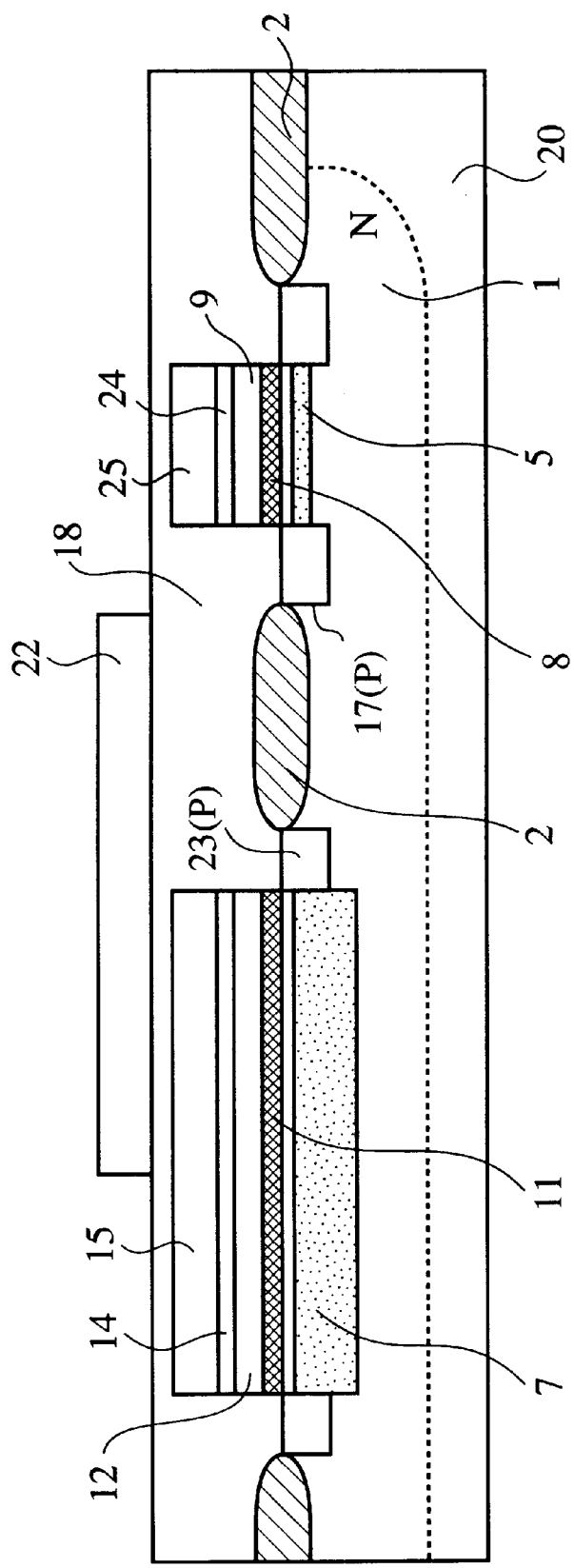

Among sectional views of FIGS. 6 through 17 showing steps for fabricating the semiconductor integrated circuit device, FIG. 17 is a sectional view showing the LSI in the final stage of the steps.

FIG. 17 shows part where a MOS transistor and a MOS capacitor of the semiconductor integrated circuit device of the present embodiment are formed. A field oxide film 2, i.e. a device separating region, formed by LOCOS or the like is formed on the surface region of a semiconductor substrate 20 made of a P-type silicon or the like. In the present embodiment, an N well 1 is formed on the semiconductor substrate 20. A PMOS transistor is formed on the first device region of the N well 1 and a MOS capacitor is formed on the second device region of the N well 1. A P+ source/drain region 17 of the MOS transistor is formed in the first device region. A gate oxide film 8 is formed on the part between the P+source/drain regions 17 by means of thermal oxidation, for example. A gate electrode is formed on the gate oxide film 8. The gate electrode is composed of a first poly-silicon film 9 directly formed on the gate oxide film 8, a third poly-silicon film 14 formed on the first poly-silicon film 9, and a tungsten silicide film 15 formed on the third poly-silicon film 14. Also, the semiconductor substrate 20 under the gate oxide film is formed with a channel ion implanting layer 5.

Meanwhile, a silicon oxide film 11 which becomes a dielectric film of the capacitor is formed on the second device region. Then, a capacitor electrode is formed on the silicon oxide film 11. The capacitor electrode is composed of a second poly-silicon film 12 directly formed on the silicon oxide film 11, another third poly-silicon film 14 formed on the second poly-silicon film 12 and another tungsten silicide film 15 formed on the third poly-silicon film 14.

Further, a P-type impurity diffusing region 7 into which boron or the like is ion-implanted is formed on the semiconductor substrate 20 below the silicon oxide film 11. The P-type impurity diffusing region 7 is used as bias dependency control means and acts as an opposite electrode of the capacitor electrode formed on the silicon oxide film 11. A P-type high concentrate impurity diffusing region 23 is formed in the surface region where the silicon oxide film 11 of the second device electrode is not formed. It is used as a contact region in connecting with an external terminal.

The depth of the P-type impurity diffusing region 7 from the surface of the substrate is about 0.2 μm which is deeper than the depth of the P-type high concentrate impurity diffusing region 23 from the surface of the substrate of 0.1 to 0.2 μm. Further, the impurity concentration of the P-type impurity diffusing region 7 is 1E14 $cm^{-3}$ to 1E20 $cm^{-3}$, which is thinner than that of the P-type high concentrate impurity diffusing region 23 of about 1E20 $cm^{-3}$. The impurity concentration and the depth from the surface of the substrate of the P-type high concentrate impurity diffusing region 23 are both equal to those of the P+ source/drain region 17 of the MOS transistor.

Figure 5:
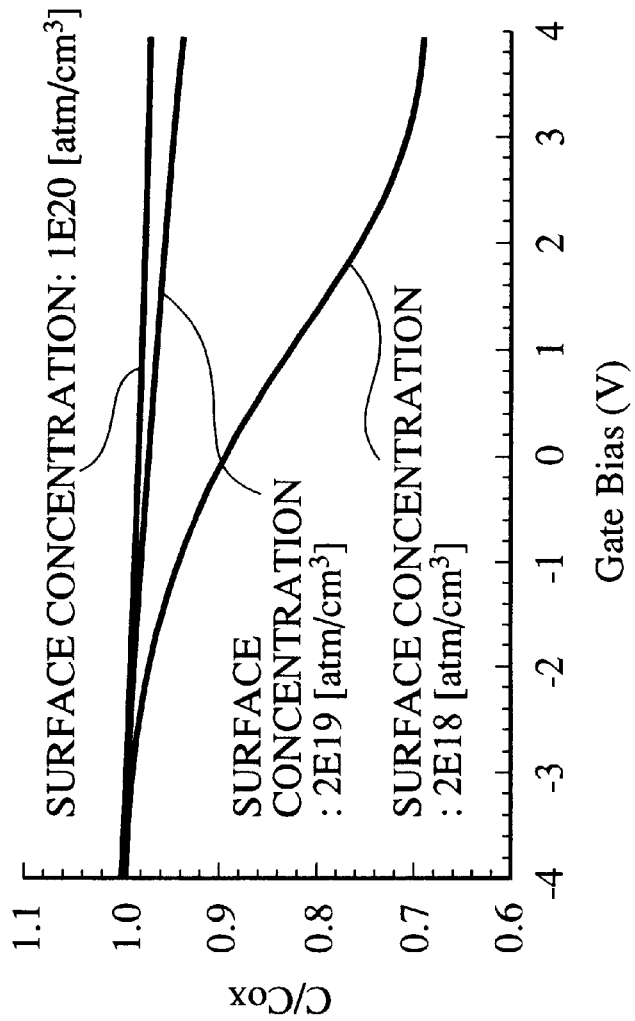
FIG. 5 is a chart showing a C-V characteristics of the capacitor showing a dependency on surface concentration of the MOS capacitor.

The C-V characteristics of the MOS capacitor changes as the impurity concentration (surface concentration) of the P-type impurity diffusing region 7 changes as the P-type impurity diffusing region 7 is used as a bias dependency control means of the MOS capacitor. FIG. 5 is a characteristics chart showing the surface concentration dependency of the C-V characteristics of the MOS capacitor. The vertical axis represents a ratio of capacity C/Cox and the horizontal axis represents a gate bias (V). C denotes a value when a capacity of depletion layer is connected in series with a gate capacity and Cox denotes the gate capacity, i.e. the capacity of the gate oxide film. It can be seen from the chart that the C-V characteristics of the MOS capacitor degrades when the surface concentration of the impurity diffusing region used as the bias dependency control means is thin. That is, the depletion layer becomes thick and the capacity of the capacitor becomes small when the surface concentration is thick. Accordingly, it is preferable to thicken the impurity concentration of the above-mentioned impurity diffusing region as much as possible. The impurity concentration is preferable to be in a range from $1 \times E14 cm^{-3}$ to $1 \times E20 cm^{-3}$.

A BPSG film 18, for example, is coated on the semiconductor substrate 20 so as to protect the MOS capacitor and the MOS transistor. The surface of the BPSG film 18 is flattened by means of CMP, for example. A metal wire 22, such as an aluminum wire, is formed on the flattened surface. A passivation film is coated further on the semiconductor substrate, thus completing the semiconductor chip.

FIGS. 6 through 16 are sectional views sequentially showing the steps for fabricating the semiconductor integrated circuit device.

Figure 6:
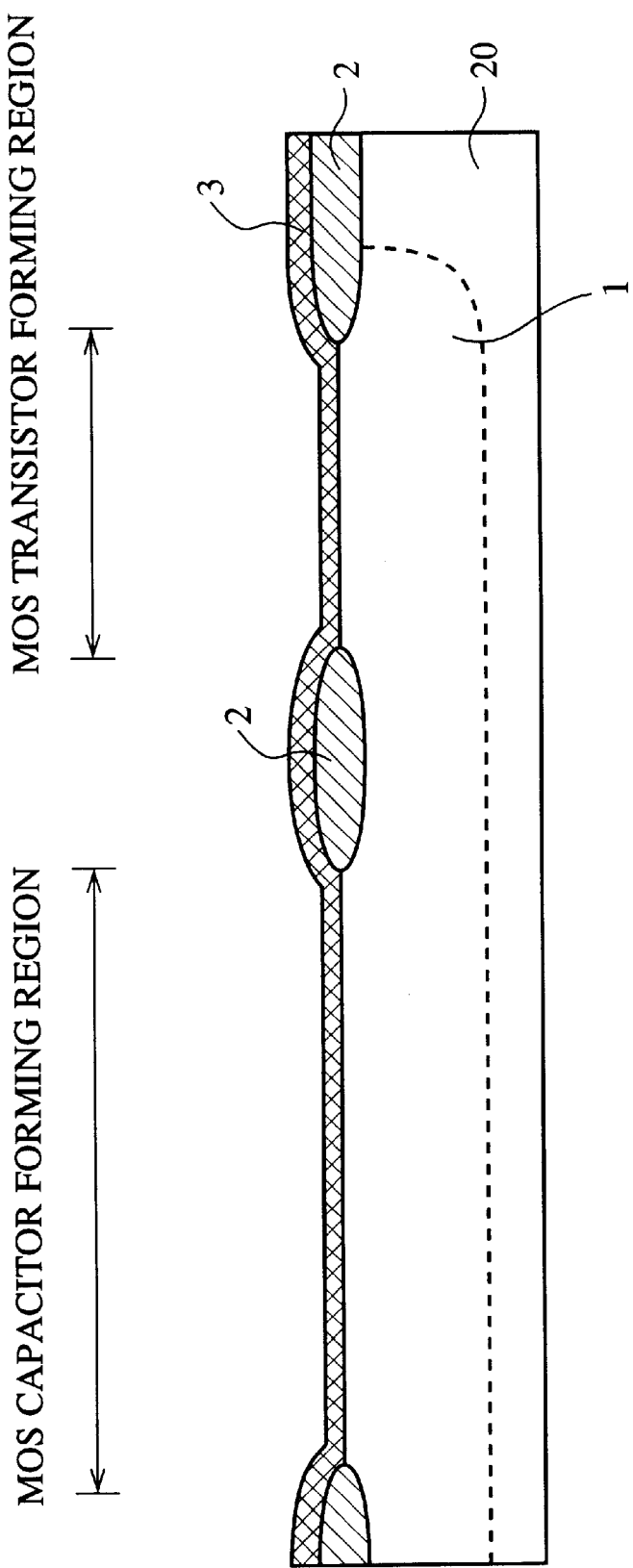
FIGS. 6 through 17 are section views sequentially showing steps for fabricating the semiconductor integrated circuit device of the invention.

At first, the field oxide film 2 having a thickness of 600 nm is formed on the surface region of the P-type silicon semiconductor substrate 20 and then the dummy gate oxide film 3 is formed by thermal oxidation or the like as shown in FIG. 6. Further, the N well 1 is formed selectively. The region for forming the MOS transistor (first device region) and the region for forming the MOS capacitor (second device region) are provided in the N well 1 surrounded by the field oxide film 2, i.e. the device separating region.

Figure 7:
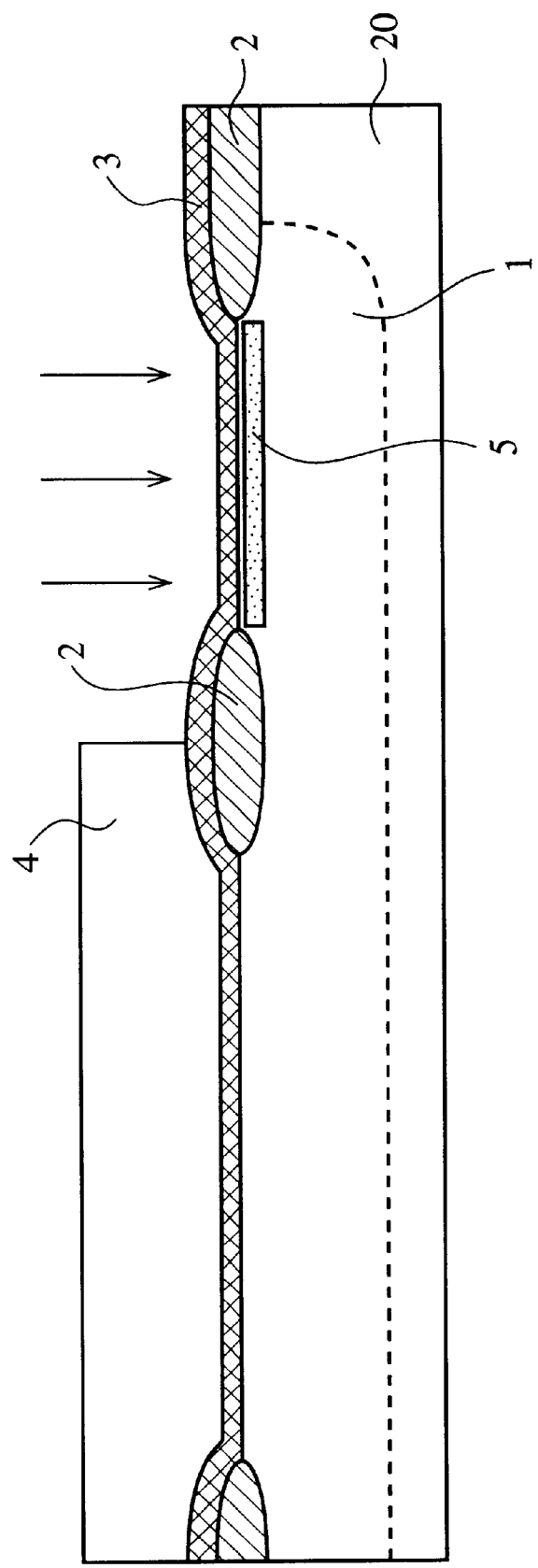

Next, as shown in FIG. 7, the MOS capacitor forming region is masked by photoresist 4 and a channel ion implanting layer 5 having a surface concentration of $2E17 cm^{-3}$ is formed in forming the P-type MOS transistor in the MOS transistor forming region by implanting p (phosphorus) ions of $1.8E13 cm^{-2}$ of dose with 140 KeV of double charged acceleration voltage, by implanting As (arsenic) ions of $1E12 cm^{-2}$ of dose with 150 KeV of double charged acceleration voltage and by implanting B (boron) ions of $1E12 cm^{-2}$ of dose with 40 KeV of acceleration voltage. The channel ion implanting layer is formed in the same manner also when an N-type MOS transistor is formed differing from the present embodiment.

Figure 8:
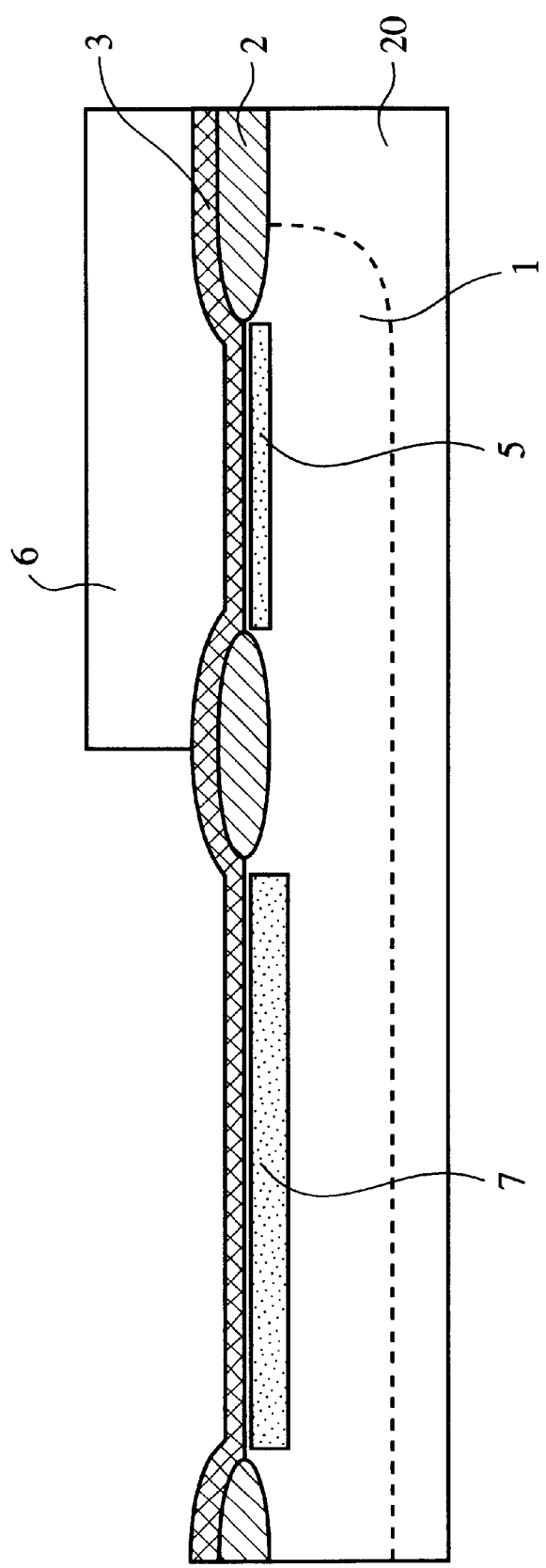

Next, as shown in FIG. 8, after removing the photoresist 4 from the semiconductor substrate 20, the P-type impurity diffusing region 7 having a surface concentration of $2E18 cm^{-3}$ is formed by masking the MOS transistor forming region by photoresist 6 and by implanting B (boron) ions of $65E12 cm^{-2}$ of dose to the MOS capacitor forming region with 35 KeV of acceleration voltage. At this time, the P-type MOS capacitor is formed. The P-type impurity diffusing region 7 is used as the bias dependency control means as well as the capacitor electrode. The electrode impurity layer is formed in the same manner not only in forming the P-type MOS capacitor but also in forming an N-type MOS capacitor.

Figure 9:
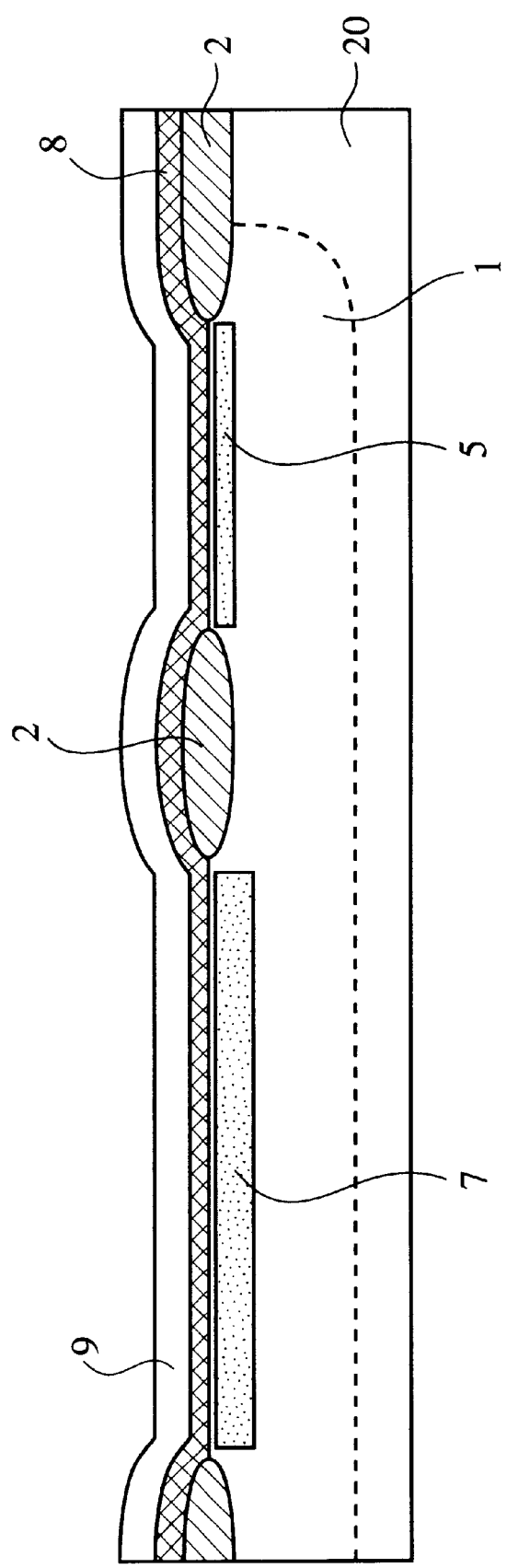

Next, the dummy gate oxide film 3 is peeled off after removing the photoresist 6 as shown in FIG. 9. Then, thermal oxidation is implemented at 750° C. to form the gate oxide film 8 having a thickness of 9 nm on the semiconductor substrate 20. Then, the first poly-silicon film 9 having a thickness of 150 nm is formed on the gate oxide film 8.

Figure 10:
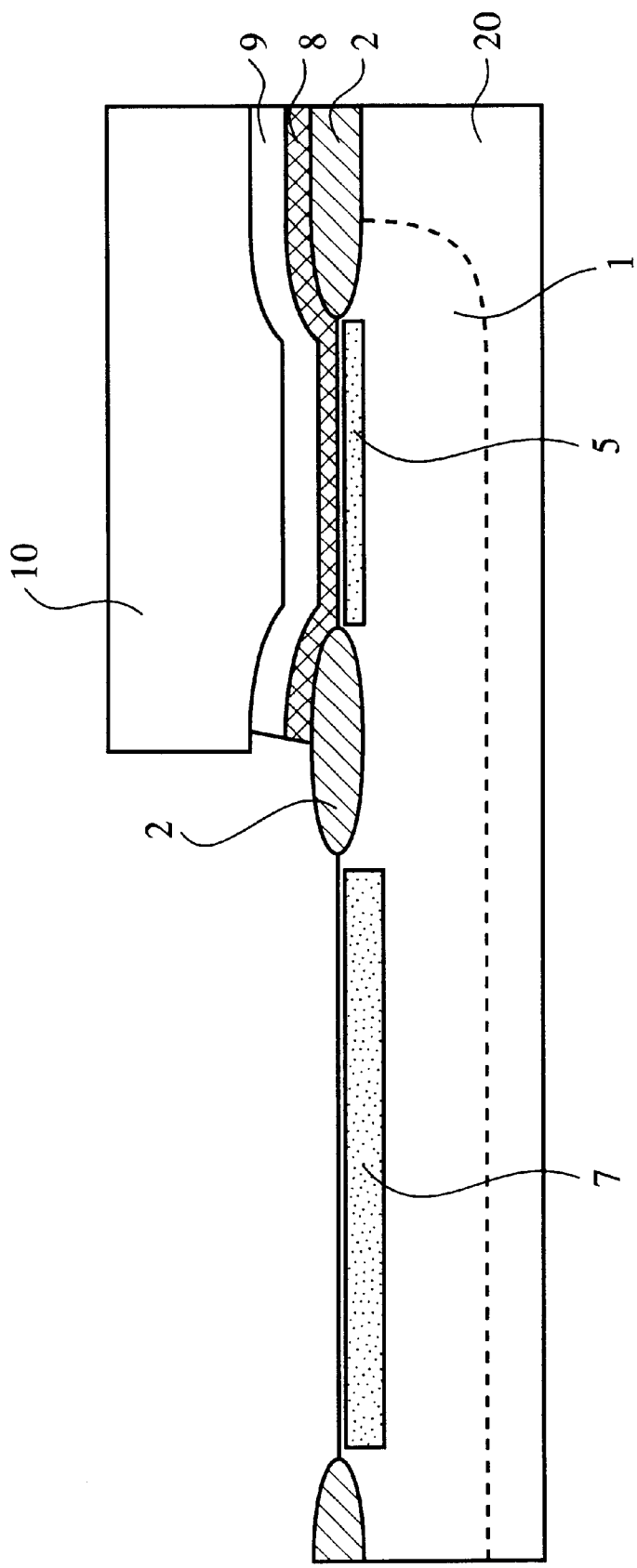

Next, the MOS transistor forming region is masked by photoresist 10 as shown in FIG. 10 to etch and remove the first poly-silicon film 9 and the gate oxide film 8 at the part other than the gate electrode forming region of the MOS transistor forming region.

Figure 11:
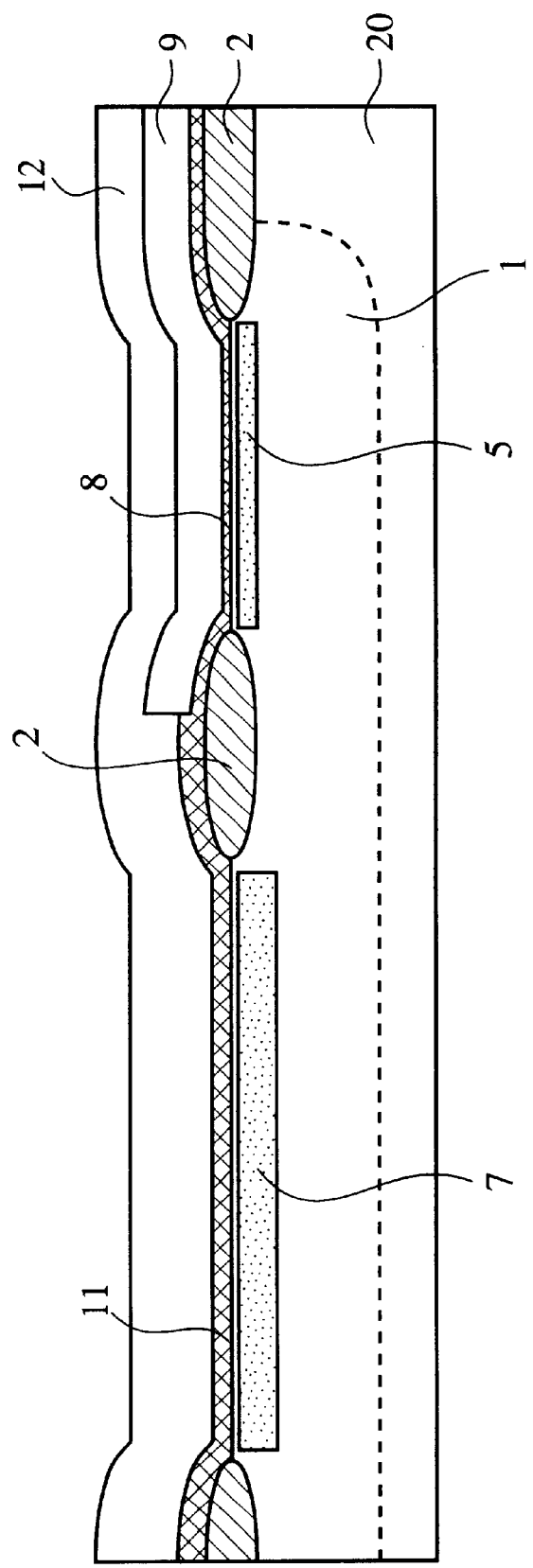

Then, the silicon oxide film 11 which is the dielectric film of the MOS capacitor having a thickness of 35 nm is formed in the MOS capacitor forming region by thermally treating the semiconductor substrate at 800° C. after removing the photoresist 10 as shown in FIG. 11. At this time, the surface of the first poly-silicon film 9 is also oxidized. Then, the second poly-silicon film 12 having a thickness of 150 nm is deposited on the silicon oxide film 11 and the first poly-silicon film 9.

Figure 12:
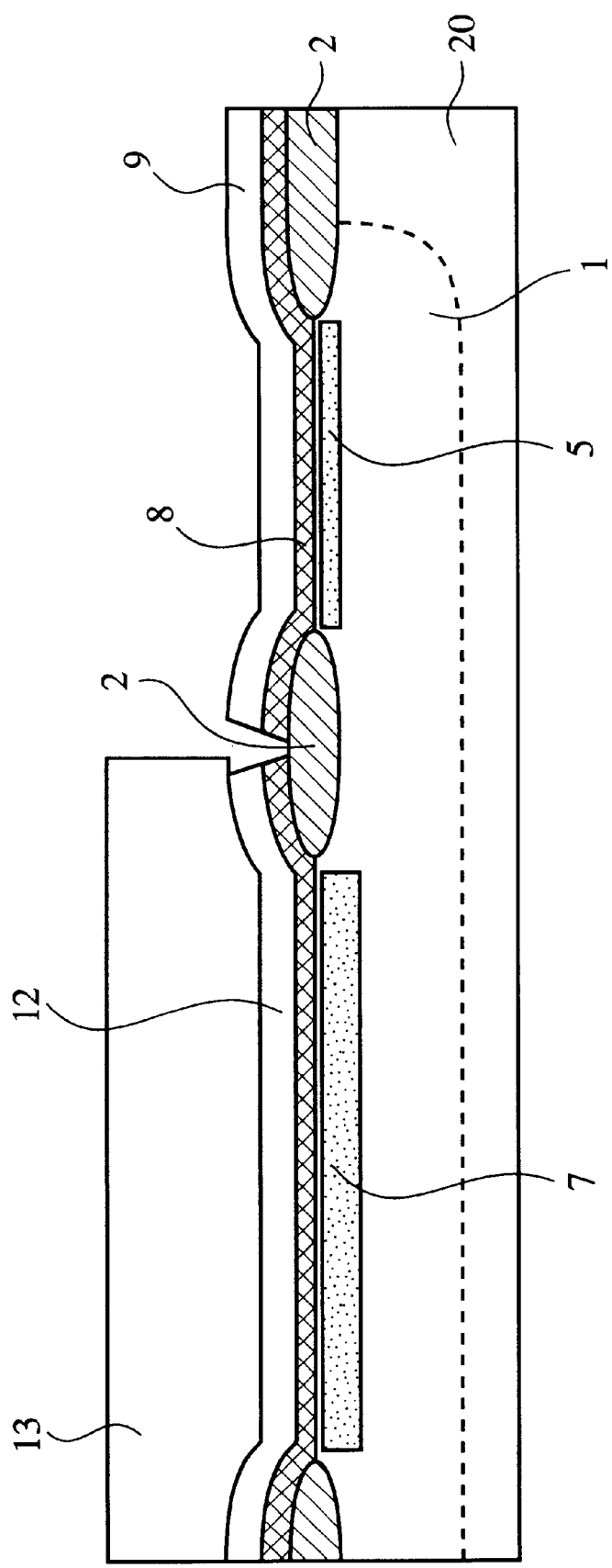

Next, the second poly-silicon film 12 at the part other than the MOS capacitor forming region is etched and removed by masking photoresist 13 as shown in FIG. 12.

Figure 13:
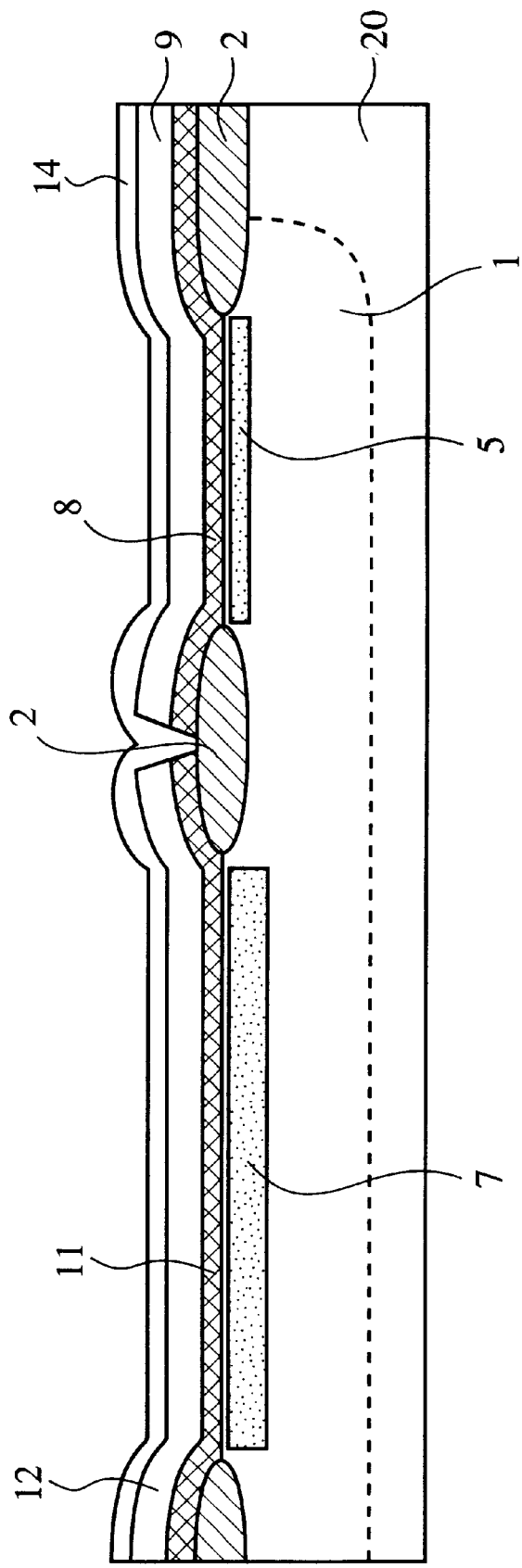

Then, the oxide film formed on the first poly-silicon film 9 is removed and the third poly-silicon film 14 is deposited on the first and second poly-silicon films 9 and 12 as shown in FIG. 13. Then, impurity is diffused within the third poly-silicon film 14.

Figure 14:
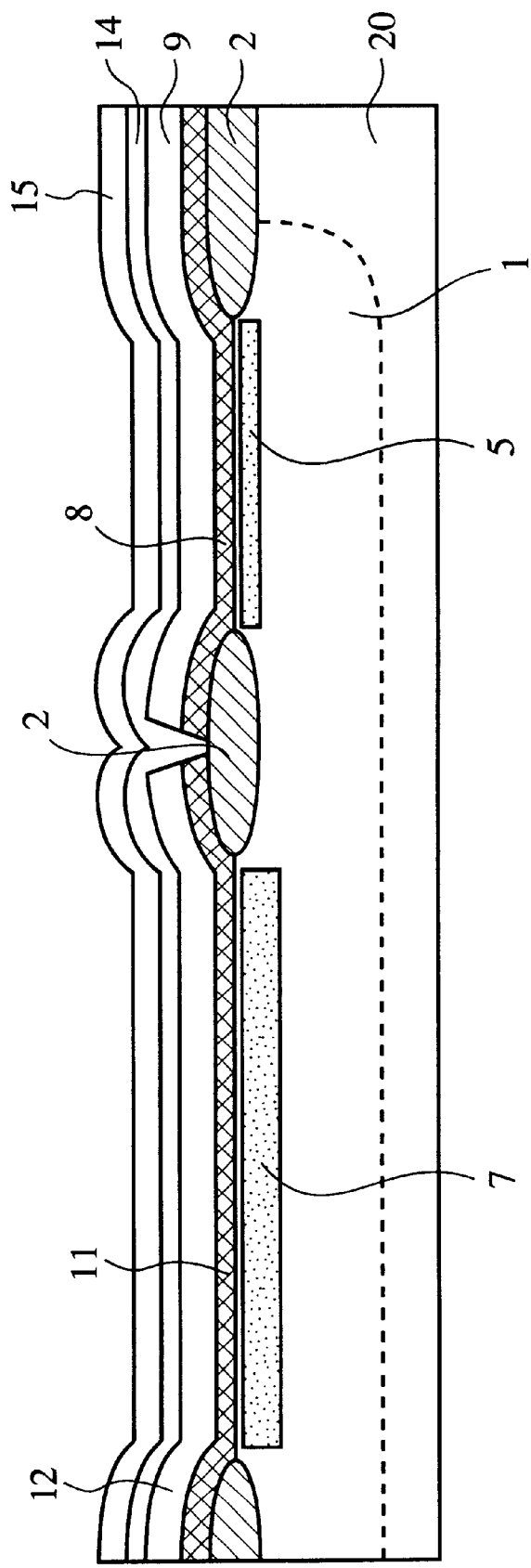

Next, the tungsten silicide film 15 is deposited on the third poly-silicon film 14 as shown in FIG. 14.

Then, the gate electrode of the MOS transistor and the electrode of the MOS capacitor are patterned at one time by forming patterned photoresist 16 on the tungsten silicide film 15 and using it as a mask as shown in FIG. 15. Then the gate electrode comprising of the poly-silicon film 9, the poly-silicon film 24 and the tungsten silicide film 25 is formed, and the capacitor electrode comprising the poly-silicon film 12, the poly-silicon film 14 and the tungsten silicide film 15 is formed.

Next, the P+ source/drain region 17 is formed in the MOS transistor forming region and the high concentrate P-type contact region 23, having the equal surface concentration with the P+ source/drain region 17, for ohmically connecting an external terminal is formed in the MOS capacitor forming region, respectively, as shown in FIG. 16.

Then, the MOS capacitor is formed in the MOS capacitor forming region and the MOS transistor is formed in the MOS transistor forming region, respectively. After that, the BPSG film 18 is deposited on the MOS capacitor and the MOS transistor as an interlayer insulating film.

Next, the BPSG film 18 is flattened by using the well-known CMP technology as shown in FIG. 17. Then, the metal wire 22, such as aluminum wire, is formed on the flattened surface. Then, the passivation film is coated on the surface of the semiconductor substrate 20, thus completing the semiconductor chip.

Figure 18:
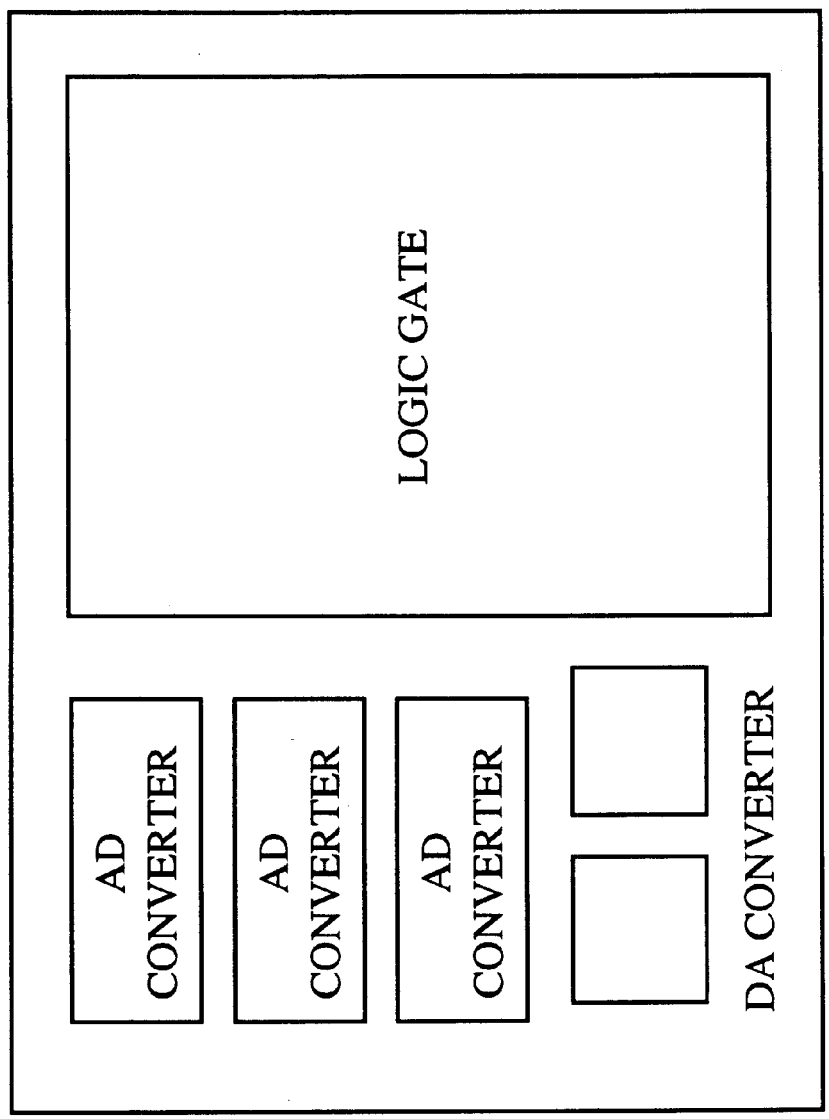
FIG. 18 is a plan view showing a semiconductor chip on which the inventive semiconductor integrated circuit device is formed.
Figure 19:
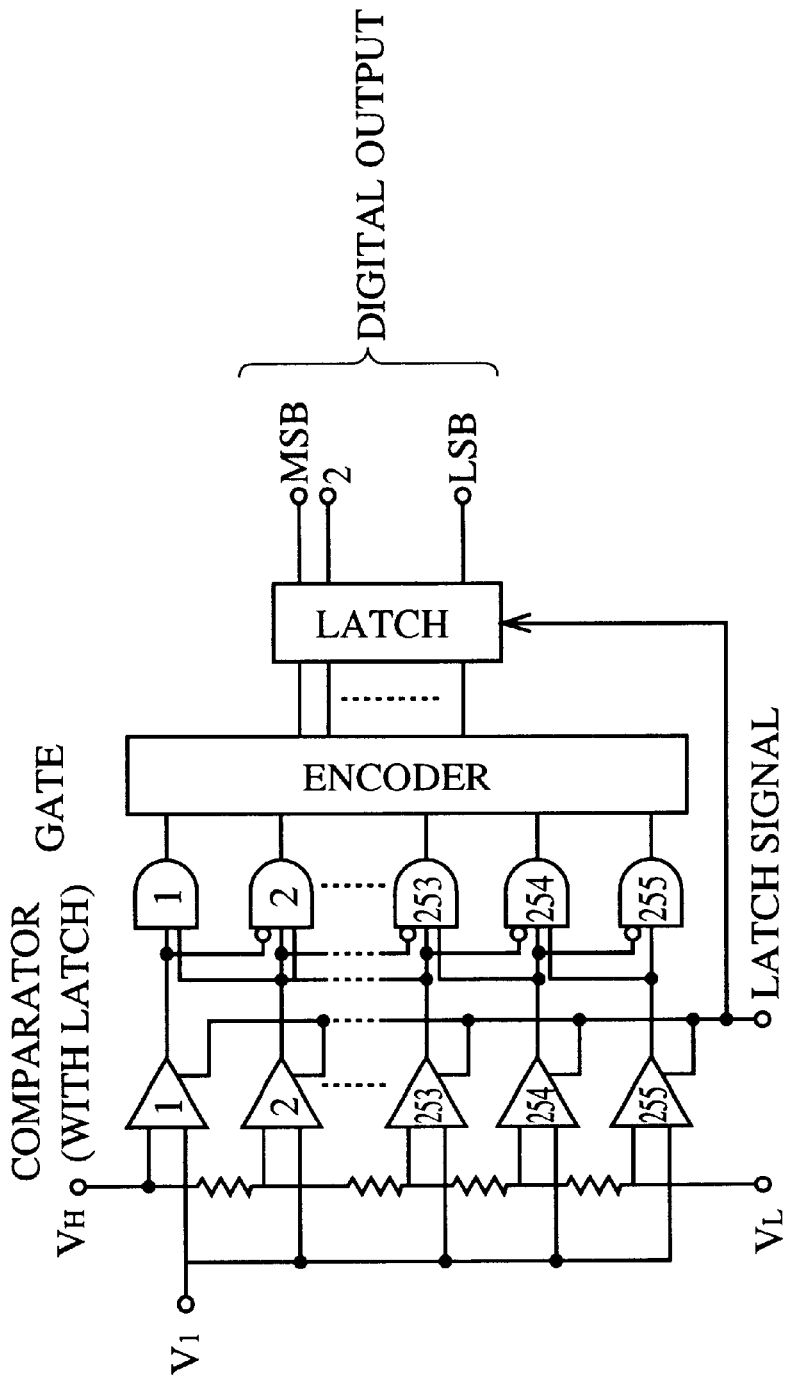
FIG. 19 is a circuit diagram of a converter of the semiconductor integrated circuit shown in FIG. 18.
Figure 20:
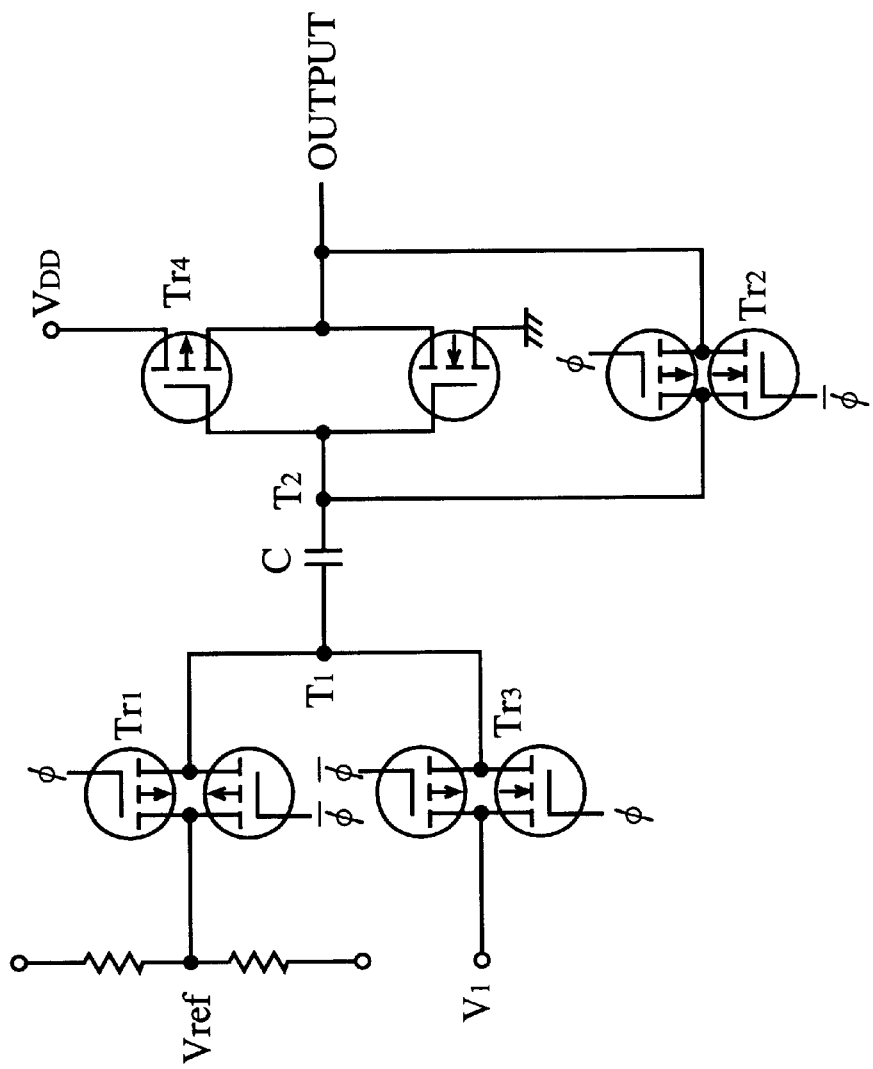
FIG. 20 is a circuit diagram of a comparator of the converter shown in FIG. 19.

FIG. 18 is a diagrammatic plan view showing an A/D converter consolidated semiconductor chip carrying the inventive semiconductor integrated circuit device. The MOS capacitor and the MOS transistor shown in FIG. 2 are formed in the converter (A/D (8 bits)) of the consolidated chip. A circuit diagram in FIG. 19 shows the circuit of the A/D converter in detail and FIG. 20 shows a comparator thereof. The P-type MOS transistor and the MOS capacitor shown in FIG. 20 are the transistor and the capacitor shown in FIG. 2. The above-mentioned A/D converter circuit divides a full-scale voltage (VH–VL=VFS) by a resistive dividing circuit per 2 to 8 VFS to use each voltage as a reference of comparison made by 255 comparators. Meanwhile, when an analog input signal VI is applied to the other input terminal of the comparator, an output of the comparator having a comparison reference potential of less than VI turns out to be all "1" and to be all "0" on the opposite side. A boundary between the "0" output group and the "1" output group is found by the following gate circuit and a binary output is obtained by an encoder at the later stage.

The comparator is the essential element of this A/D converter circuit and FIG. 20 shows its circuit using the MOS technology. The MOS capacitor and the MOS transistor along a line A–A' in FIG. 2 are the capacitor C and the MOS transistor Tr4 in FIG. 20. MOS capacitor C is connected with MOS transistor Tr2 and Tr4 via terminal T2. Terminal T2 is formed in well region 1. MOS capacitor C is connected with MOS transistor Tr1 and Tr3 via terminal T1. Terminal T1 is formed with aluminum wire 22. A comparison amplifier is in a linear region and an output level is "0" when MOS switches Tr1 and Tr2 are on for a half cycle of a clock f. In the same time, a reference voltage is charged to the capacitor C. The switches Tr1 and Tr2 are turned off and a switch Tr3 is turned on in the next half cycle. The voltage gain of the comparison amplifier increases because the negative feedback route is eliminated. Because an input voltage is applied to the capacitor, charge is injected to the gate part of the amplifier from the input terminal, a gate voltage of the amplifier increases and the output of the amplifier is "0" when VI>Vref. When VI<Vref on the other hand, the output of the amplifier is "1".

Next, a third embodiment of the present invention will be explained with reference to FIGS. 21 through 29 which are all sectional views showing Steps for fabricating the semiconductor integrated circuit device.

Figure 21:
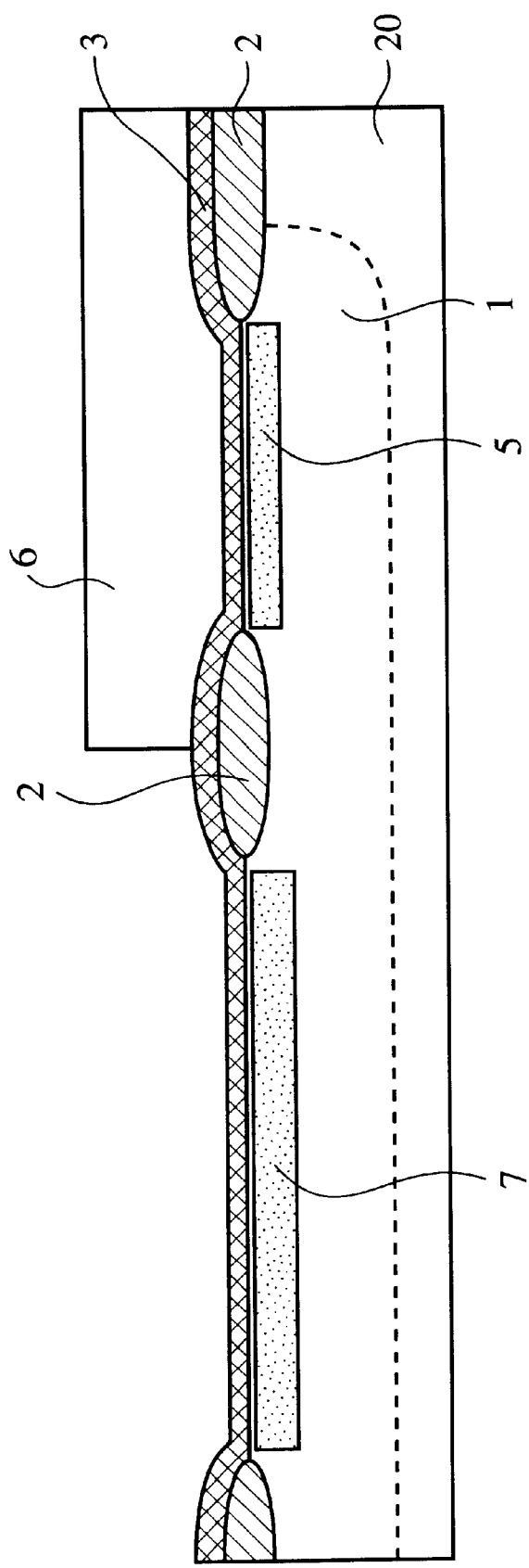
FIGS. 21 through 29 are section views sequentially showing steps for fabricating the semiconductor integrated circuit device of the invention.

At first, the field oxide film 2 having a thickness of 600 nm is formed on the surface region of the P-type silicon semiconductor substrate 20 and then the dummy gate oxide film 3 is formed by thermal oxidation or the like as shown in FIG. 21. Further, the N well 1 is formed selectively. The region for forming the MOS transistor first device region) and the region for forming the MOS capacitor (second device region) are provided in the N well 1 surrounded by the field oxide film 2, i.e. the device separating region.

Next, the MOS capacitor forming region is masked by photoresist 4 and a channel ion implanting layer 5 having a surface concentration of $2E17$ $cm^{-3}$ is formed in forming the P-type MOS transistor in the MOS transistor forming region by implanting P (phosphorus) ions of $1.8E13$ $cm^{-2}$ of dose with 140 KeV of double charged acceleration voltage, by implanting As (arsenic) ions of $1.2E13$ $cm^{-2}$ of dose with 150 KeV of double charged acceleration voltage and by implanting B (boron) ions of $5.2E12$ $cm^{-2}$ of dose with 25 KeV of acceleration voltage. The channel ion implanting layer is formed in the same manner also when an N-type MOS transistor is formed differing from the present embodiment. Because the above-mentioned steps are the same as the steps shown in FIG. 7, the photoresist 4 is not shown.

Next, as shown in FIG. 21, after removing the photoresist 4 from the semiconductor substrate 20, the P-type impurity diffusing region 7 having a surface concentration of $2E18$ $cm^{-3}$ is formed by masking the MOS transistor forming region by photoresist 6 and by implanting B (boron) ions of $65E12$ $cm^{-2}$ of dose to the MOS capacitor forming region with 35 KeV of acceleration voltage. At this time, the P-type MOS capacitor is formed. The P-type impurity diffusing region 7 is used as the bias dependency control means as well as the capacitor electrode. The electrode impurity layer is formed in the same manner not only in forming the P-type MOS capacitor but also in forming an N-type MOS capacitor.

Figure 22:
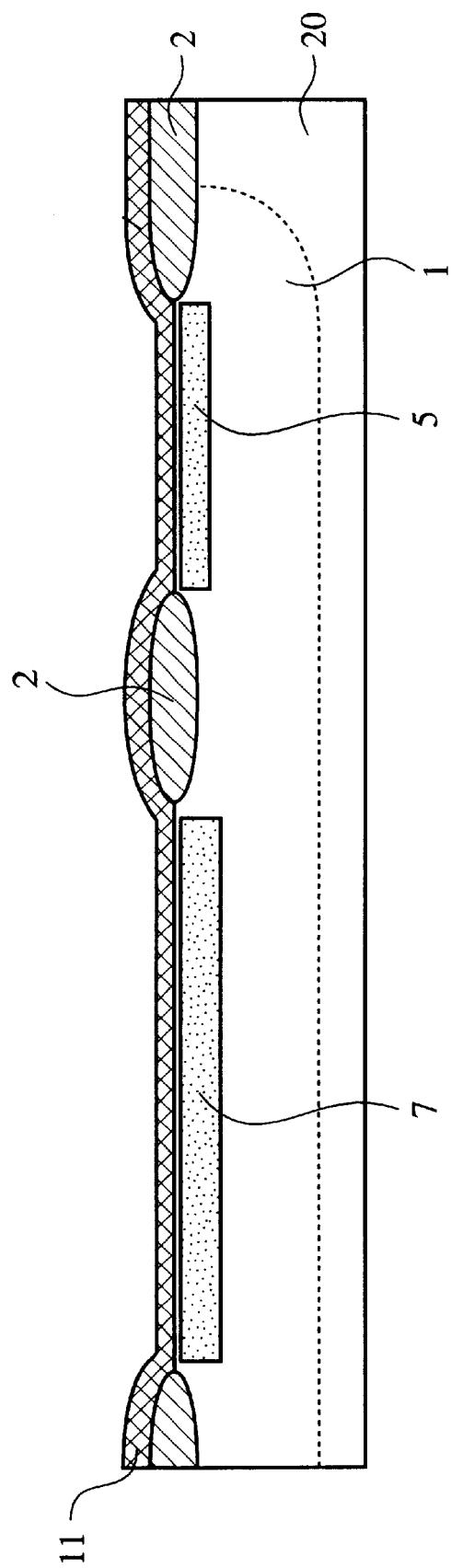

Next, the dummy gate oxide film 3 is peeled off after removing the photoresist 6 as shown in FIG. 22. Then, the semiconductor substrate 20 is treated by heat at 800° C. to form the silicon oxide film 11 which is the dielectric film of the MOS capacitor having a thickness of 35 nm and formed in the MOS capacitor forming region.

Figure 23:
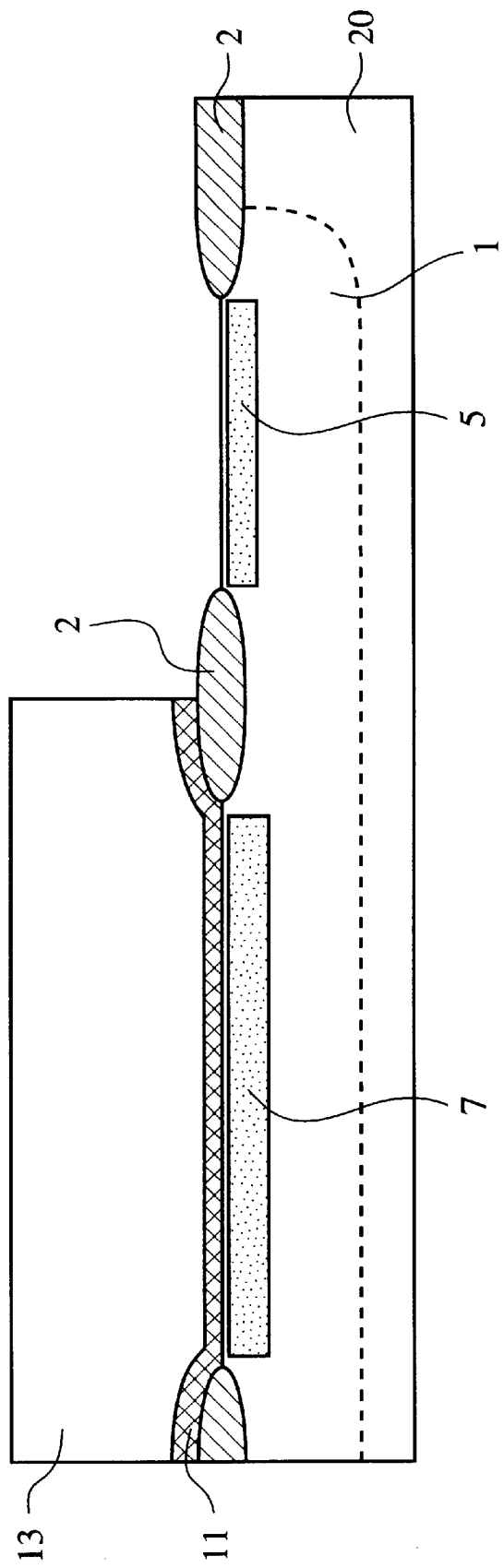

Next, the MOS capacitor region is masked by photoresist 13 to etch and remove the silicon oxide film 11 at the part other than the MOS capacitor region as shown in FIG. 23.

Figure 24:
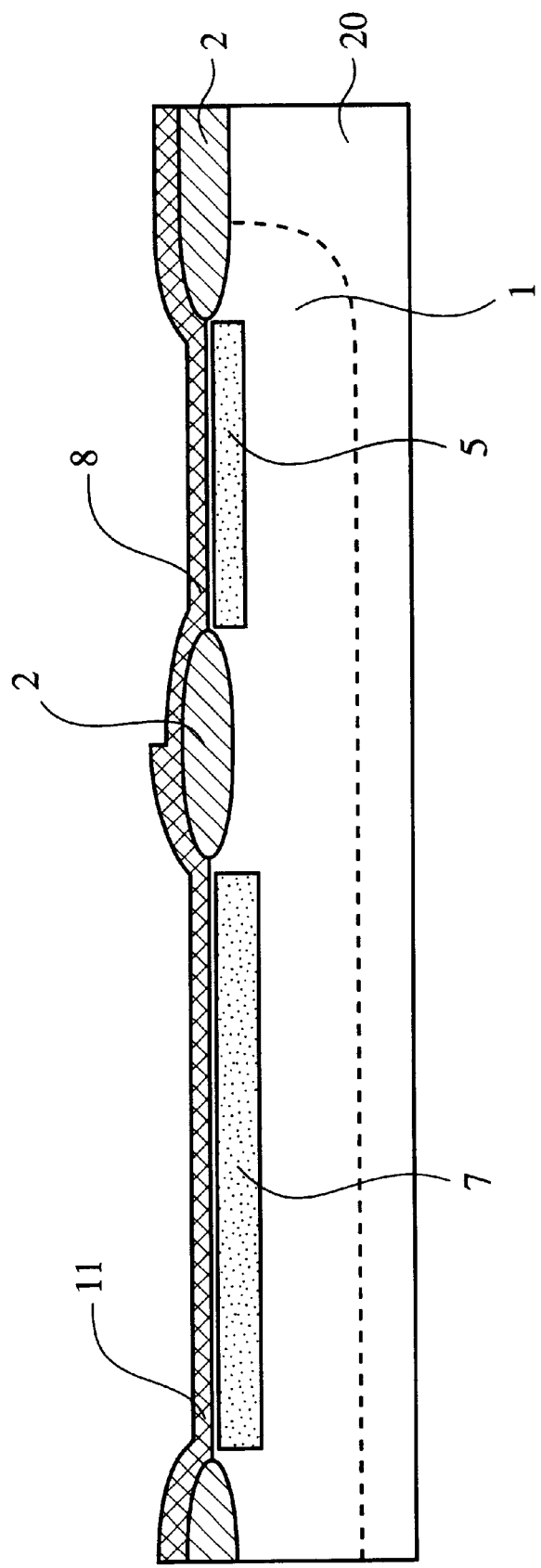

Then, after removing the photoresist 13, the thermal oxidation at 750° C. is implemented to form the gate oxide film 8 having a thickness of 9 nm on the semiconductor substrate 29 as shown in FIG. 24.

Figure 25:
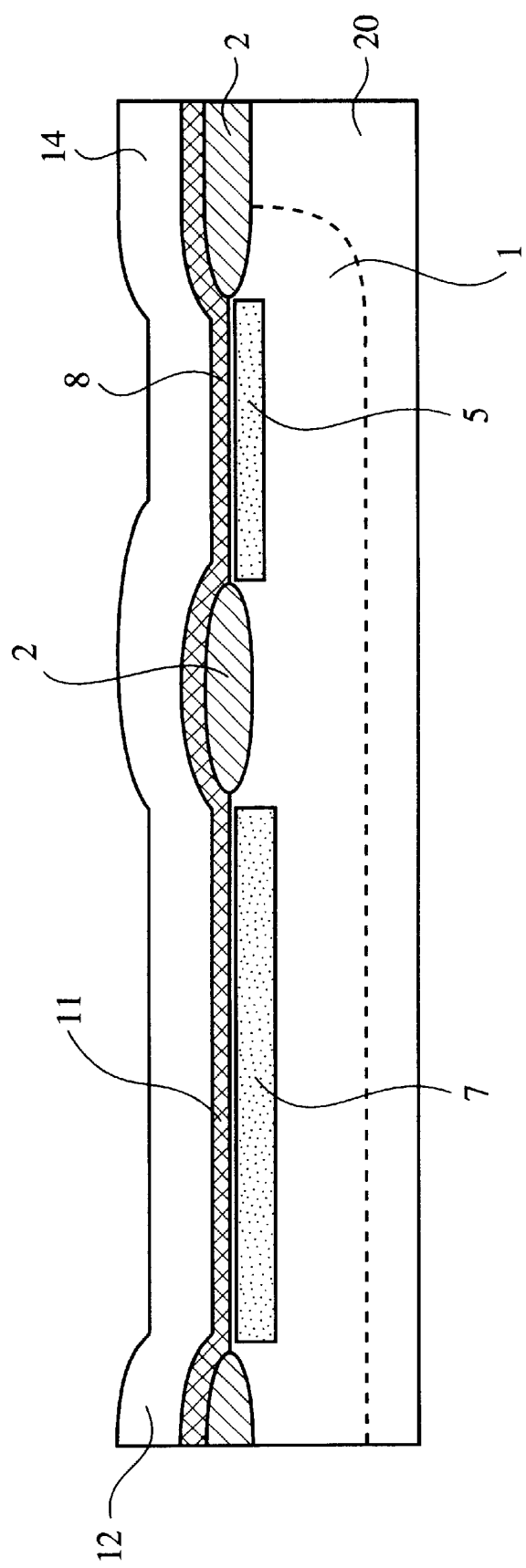

Then, a second poly-silicon film 12 having a thickness of 200 nm is deposited on the silicon oxide film 11 which is the dielectric of the MOS capacitor and the gate oxide film 8 of the MOS transistor as shown in FIG. 25. After that, impurity is diffused in the second poly-silicon film 12.

Figure 26:
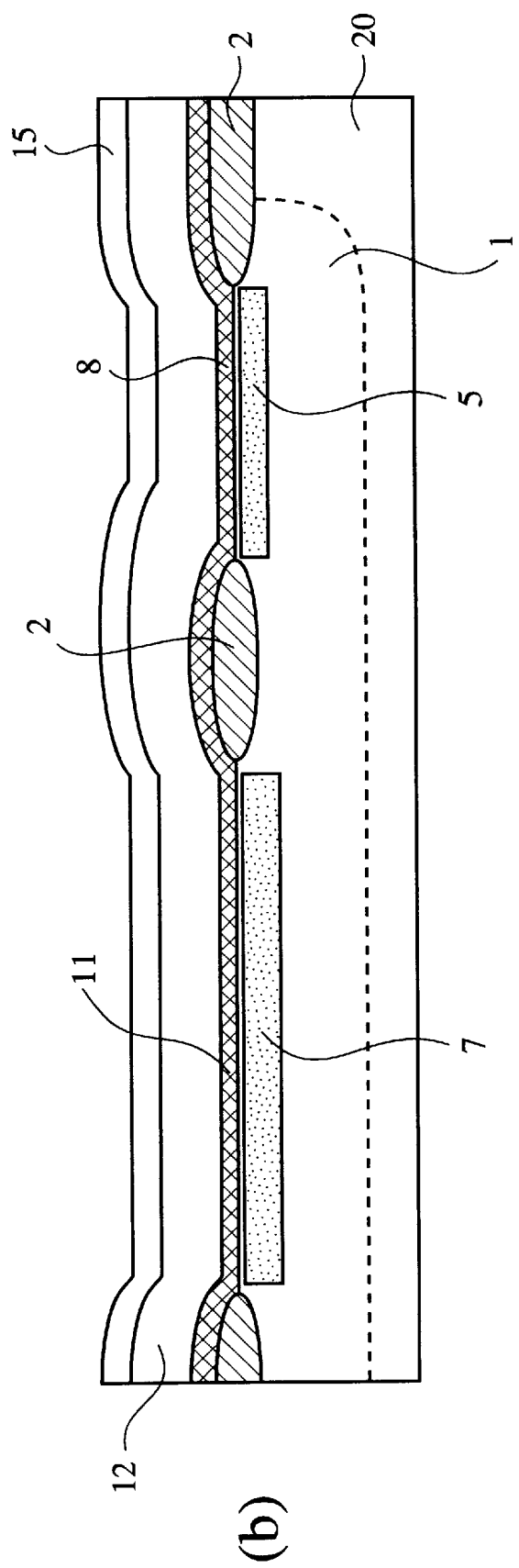

Next, the tungsten silicide film 15 is deposited on the second poly-silicon film 12 as shown in FIG. 26.

Figure 27:
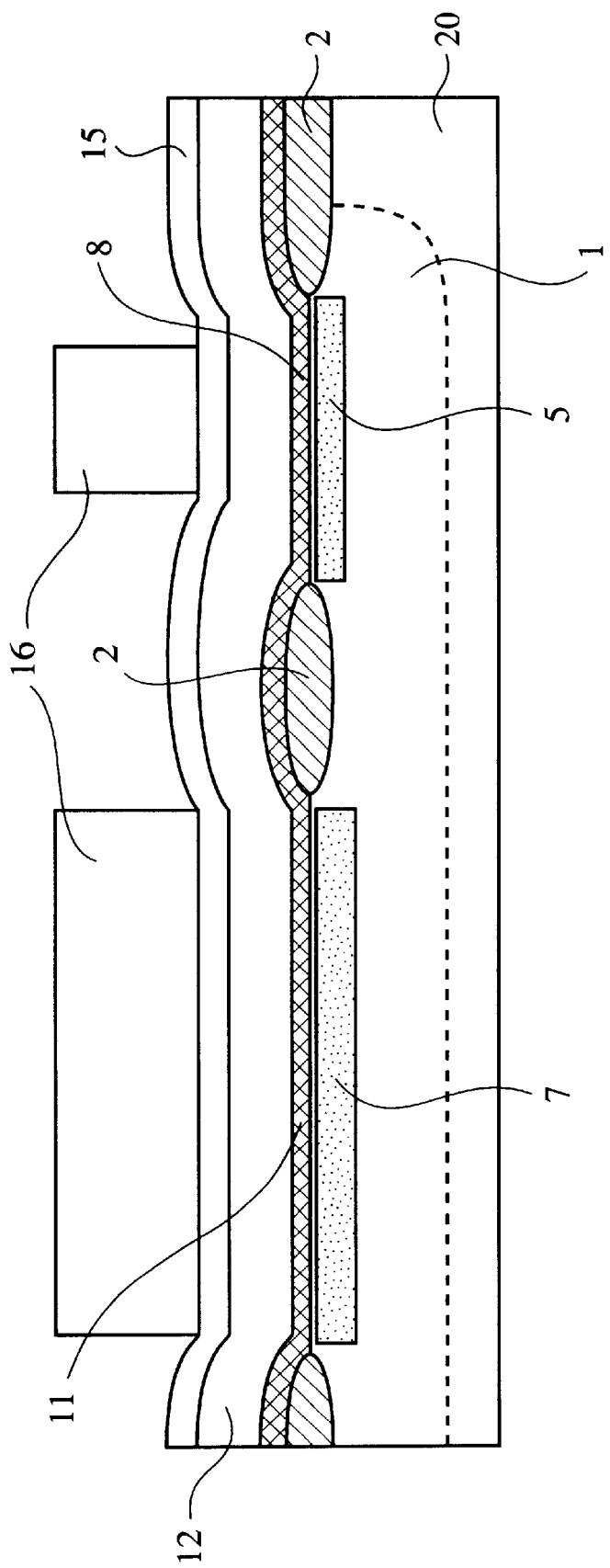

Then, the gate electrode of the MOS transistor and the electrode of the MOS capacitor are patterned at one time by forming patterned photoresist 16 on the tungsten silicide film 15 and by using it as a mask as shown in FIG. 27. Then, a capacitor electrode is formed on the silicon oxide film 11. The capacitor electrode comprising a poly-silicon film 12 on the silicon oxide film 11 and tungsten silicide film 15 on the poly-silicon film 12 is formed, and a gate electrode comprising a poly-silicon film 32 on the gate oxide film and tungsten silicide film 15 on the poly-silicon film 32 is formed.

Figure 28:
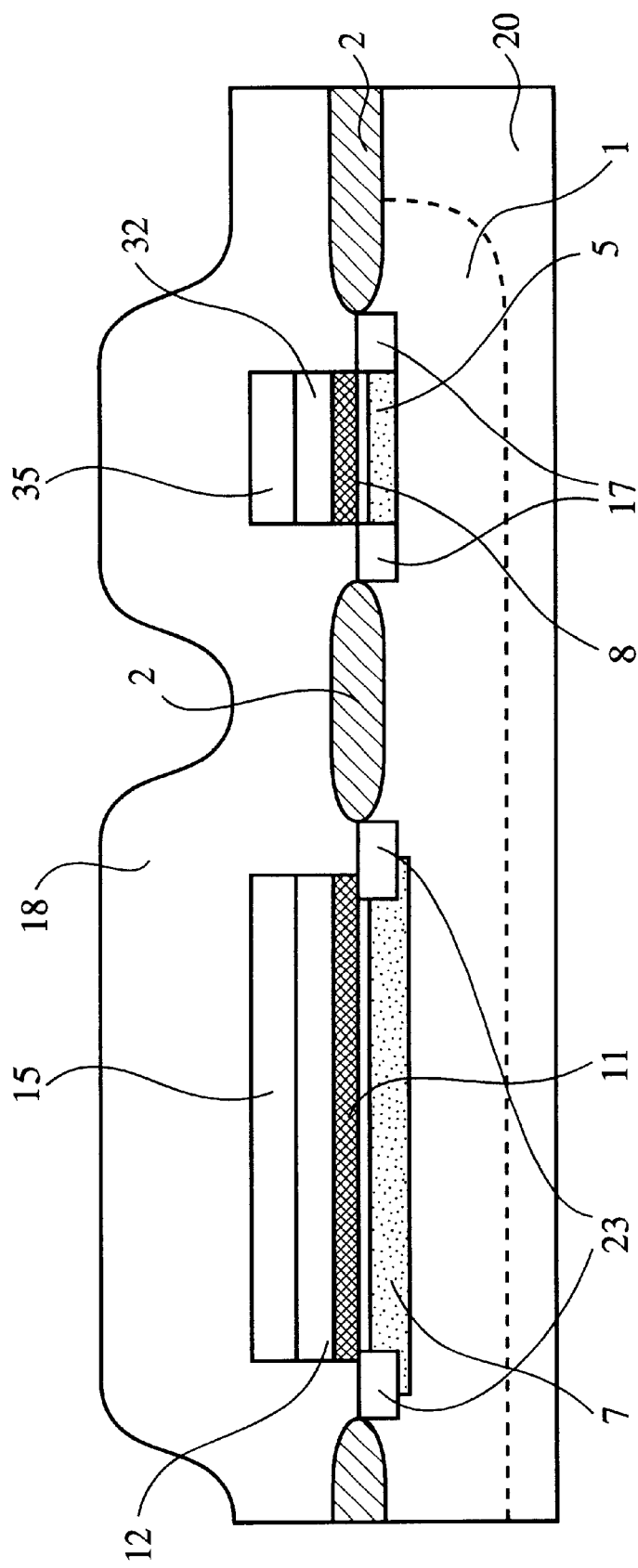

Next, the P+ source/drain region 17 is formed in the MOS transistor forming region and the high concentrate P-type contact region 23, having the equal surface concentration with the P+ source/drain region 17, for ohmically connecting an external terminal is formed in the MOS capacitor forming region, respectively, as shown in FIG. 28. Then, the MOS capacitor is formed in the MOS capacitor forming region and the MOS transistor is formed in the MOS transistor forming region, respectively. After that, the BPSG film 18 is deposited on the MOS capacitor and the MOS transistor as an interlayer insulating film.

Figure 29:
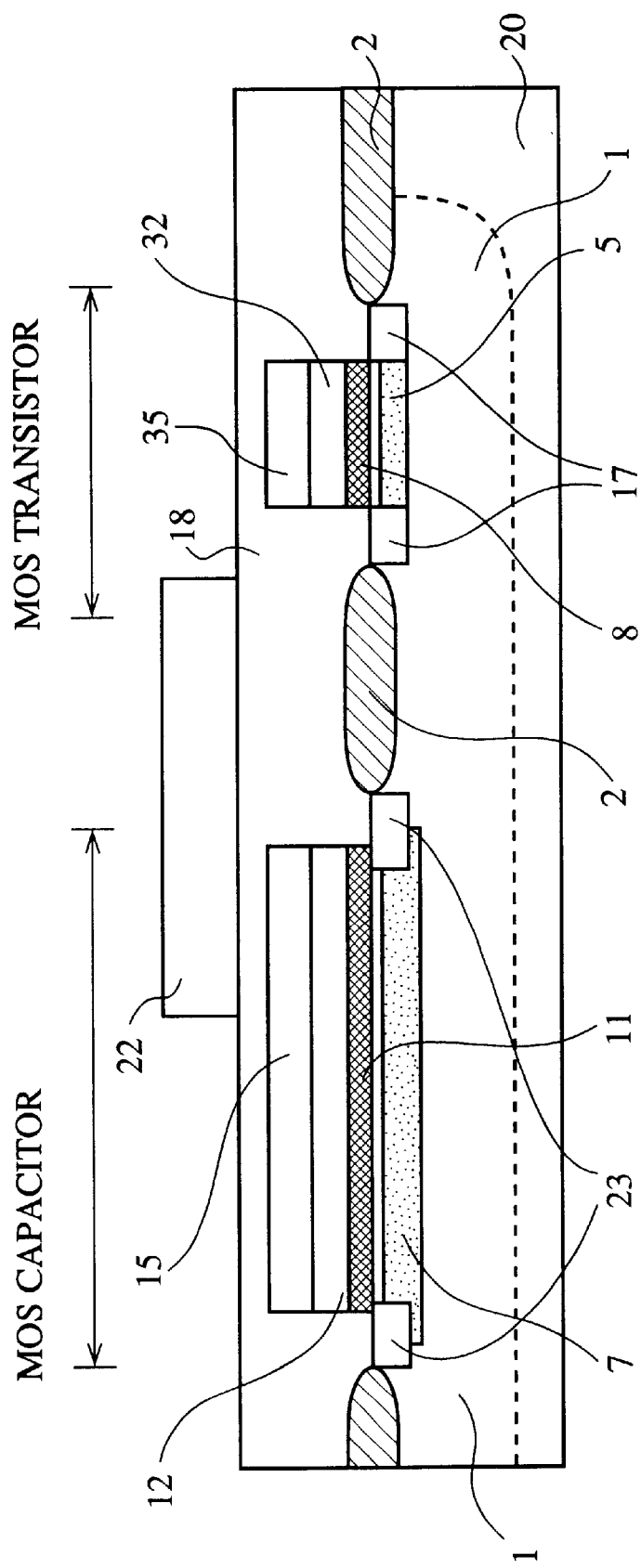

Next, the BPSG film 18 is flattened by using the well-known CMP technology as shown in FIG. 29. Then, the metal wire 22, such as an aluminum wire, is formed on the flattened surface. Then, the passivation film is coated on the surface of the semiconductor substrate 20, thus completing the semiconductor chip.

Although a coefficient of voltage of only 50,000 ppm/v in minimum can be realized by a capacitor using oxide films having the same thickness when the thickness of the gate oxide film is 9 nm for example, the above-mentioned arrangement allows the capacitor having a coefficient of voltage of 700 ppm/V in minimum to be formed on the same substrate by forming equally the capacitor of 35 nm as described above. The coefficient of voltage is represented as $((dC/dV)/C) \times 1E6$ [ppm/V], where a gradient of the C-V curve at an arbitrary voltage is $(dC/dV)$ and a capacity at the arbitrary voltage is C. When the coefficient of voltage is small, the MOS capacitor may be charged/discharged at high speed and may be driven in high precision.

As described above, the present invention allows the high precision MOS capacitor whose coefficient of voltage is small to be realized while maintaining the performance of the MOS transistor by forming the insulating film for the MOS capacitor, beside the gate oxide film of the MOS transistor, which are thinned in order to suppress a short-channel effect and to enhance the derivability along the micronization of LSIs. It also allows the insulating film on the upper surface of the capacitor to be maintained even after CMP, because the stepped structures of the MOS transistor and the MOS capacitor are the same.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiments disclosed for carrying out this invention, but that the invention includes all embodiments falling within the scope of the appended claims.

What is claimed is:

1. A method of fabricating a semiconductor integrated circuit device, comprising the steps of:

making a device separating region which divides a semiconductor substrate into a first region where a MOS type field effect transistor is to be formed and a second region where a capacitor is to be formed;

implanting channel ions into said first region of said semiconductor substrate;

implanting impurities into said second region of said semiconductor substrate to form an impurity concentration region;

forming an oxide film on the surface of said second region;

forming a gate oxide film on the surface of said first region;

depositing a poly-silicon film on said oxide film and said gate oxide film;

diffusing impurities in said poly-silicon film;

depositing a conductive film on said poly-silicon film; and patterning said poly-silicon film and said conductive film to form a gate electrode in said first region and a capacitor electrode in said second region at the same time.

2. The method for fabricating the semiconductor integrated circuit device according to claim 1, wherein said oxide film for the capacitor is thicker than said gate oxide film.

3. The method for fabricating the semiconductor integrated circuit device according to claim 1, wherein said semiconductor integrated circuit is an analog core including an analog-digital converter.

4. The method for fabricating the semiconductor integrated circuit device according to claim 1, wherein the impurity concentration of said impurity concentration region is within a range from about $1E14$ cm$^{-3}$ to about $1E20$ cm$^{-3}$.

* * * * *